United States Patent
Gally et al.

(10) Patent No.: US 8,124,434 B2
(45) Date of Patent: *Feb. 28, 2012

(54) METHOD AND SYSTEM FOR PACKAGING A DISPLAY

(75) Inventors: Brian J. Gally, Los Gatos, CA (US); William J. Cummings, Millbrae, CA (US); Lauren Palmateer, San Francisco, CA (US); Philip D. Floyd, Redwood City, CA (US); Clarence Chui, San Mateo, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 1328 days.

This patent is subject to a terminal disclaimer.

(21) Appl. No.: 11/150,496

(22) Filed: Jun. 10, 2005

(65) Prior Publication Data

US 2006/0076637 A1    Apr. 13, 2006

Related U.S. Application Data

(60) Provisional application No. 60/613,320, filed on Sep. 27, 2004, provisional application No. 60/613,377, filed on Sep. 27, 2004, provisional application No. 60/613,467, filed on Sep. 27, 2004, provisional application No. 60/613,484, filed on Sep. 27, 2004, provisional application No. 60/613,563, filed on Sep. 27, 2004, provisional application No. 60/613,956, filed on Sep. 27, 2004.

(51) Int. Cl.
*H01L 21/00* (2006.01)
(52) U.S. Cl. .... 438/51; 359/290; 359/291; 257/E21.001
(58) Field of Classification Search ................. 438/106, 438/51; 359/290, 291
See application file for complete search history.

(56) References Cited

U.S. PATENT DOCUMENTS

| | | | |
|---|---|---|---|
| 2,534,846 | A | 12/1950 | Ambrose et al. |
| 3,439,973 | A | 4/1969 | Paul et al. |
| 3,443,854 | A | 5/1969 | Weiss |
| 3,653,741 | A | 4/1972 | Marks |
| 3,656,836 | A | 4/1972 | de Cremoux et al. |
| 3,813,265 | A | 5/1974 | Marks |

(Continued)

FOREIGN PATENT DOCUMENTS

CN    1449990    10/2003

(Continued)

OTHER PUBLICATIONS

Stark et al., An integrated process for post-packaging release and vacuum sealing of electroplated nickel packages, Transducers, 12th International Conference on Solid-State Sensors, Actuators and Microsystems, 2003, pp. 1911-1914.

(Continued)

*Primary Examiner* — Jack Chen
(74) *Attorney, Agent, or Firm* — Knobbe, Martens, Olson & Bear LLP

(57) ABSTRACT

A package structure and method of packaging for an interferometric modulator. A transparent substrate having an interferometric modulator formed thereon is provided. A backplane is joined to the transparent substrate with a seal where the interferometric modulator is exposed to the surrounding environment through an opening in either the backplane or the seal. The opening is sealed after the transparent substrate and backplane are joined and after any desired desiccant, release material, and/or self-aligning monolayer is introduced into the package structure.

20 Claims, 16 Drawing Sheets

U.S. PATENT DOCUMENTS

| | | |
|---|---|---|
| 3,955,880 A | 5/1976 | Lierke |
| 4,036,360 A | 7/1977 | Deffeyes |
| 4,074,480 A | 2/1978 | Burton |
| 4,099,854 A | 7/1978 | Decker et al. |
| 4,228,437 A | 10/1980 | Shelton |
| 4,310,220 A | 1/1982 | Kuwagaki et al. |
| 4,377,324 A | 3/1983 | Durand et al. |
| 4,383,255 A | 5/1983 | Grandjean et al. |
| 4,389,096 A | 6/1983 | Hori et al. |
| 4,403,248 A | 9/1983 | te Velde |
| 4,431,691 A | 2/1984 | Greenlee |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,954,789 A | 9/1990 | Sampsell |
| 4,956,619 A | 9/1990 | Hornbeck |
| 4,977,009 A | 12/1990 | Anderson et al. |
| 4,982,184 A | 1/1991 | Kirkwood |
| 5,018,256 A | 5/1991 | Hornbeck |
| 5,022,745 A | 6/1991 | Zayhowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,244,707 A | 9/1993 | Shores |
| 5,254,980 A | 10/1993 | Hendrix et al. |
| 5,268,533 A | 12/1993 | Kovacs et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,296,950 A | 3/1994 | Lin et al. |
| 5,304,419 A | 4/1994 | Shores |
| 5,305,640 A | 4/1994 | Boysel et al. |
| 5,311,360 A | 5/1994 | Bloom et al. |
| 5,312,513 A | 5/1994 | Florence et al. |
| 5,322,161 A | 6/1994 | Shichman et al. |
| 5,323,002 A | 6/1994 | Sampsell et al. |
| 5,325,116 A | 6/1994 | Sampsell |
| 5,327,286 A | 7/1994 | Sampsell et al. |
| 5,331,454 A | 7/1994 | Hornbeck |
| 5,339,116 A | 8/1994 | Urbanus et al. |
| 5,365,283 A | 11/1994 | Doherty et al. |
| 5,381,253 A | 1/1995 | Sharp et al. |
| 5,399,805 A | 3/1995 | Tyler et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,489,952 A | 2/1996 | Gove et al. |
| 5,497,172 A | 3/1996 | Doherty et al. |
| 5,497,197 A | 3/1996 | Gove et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,591,379 A | 1/1997 | Shores |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoads et al. |
| 5,619,366 A | 4/1997 | Rhoads et al. |
| 5,636,052 A | 6/1997 | Arney et al. |
| 5,646,768 A | 7/1997 | Kaeiyama |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,683,591 A | 11/1997 | Offenburg |
| 5,703,710 A | 12/1997 | Brinkman et al. |
| 5,710,656 A | 1/1998 | Goossen |
| 5,717,476 A | 2/1998 | Kanezawa |
| 5,739,945 A | 4/1998 | Tayebati |
| 5,745,193 A | 4/1998 | Urbanus et al. |
| 5,745,281 A | 4/1998 | Yi et al. |
| 5,771,116 A | 6/1998 | Miller et al. |
| 5,771,321 A | 6/1998 | Stern |
| 5,784,166 A | 7/1998 | Sogard |
| 5,784,189 A | 7/1998 | Bozler et al. |
| 5,784,190 A | 7/1998 | Worley |
| 5,784,212 A | 7/1998 | Hornbeck |
| 5,815,141 A | 9/1998 | Phares |
| 5,818,095 A | 10/1998 | Sampsell |

| | | | | | | |
|---|---|---|---|---|---|---|
| 5,825,528 | A | 10/1998 | Goossen | 6,741,377 B2 | 5/2004 | Miles |
| 5,835,255 | A | 11/1998 | Miles | 6,741,384 B1 | 5/2004 | Martin et al. |
| 5,837,562 | A | 11/1998 | Cho | 6,741,503 B1 | 5/2004 | Farris et al. |
| 5,842,088 | A | 11/1998 | Thompson | 6,747,785 B2 | 6/2004 | Chen et al. |
| 5,853,662 | A | 12/1998 | Watanabe | 6,775,174 B2 | 8/2004 | Huffman et al. |
| 5,856,820 | A | 1/1999 | Weigers et al. | 6,778,046 B2 | 8/2004 | Stafford et al. |
| 5,912,758 | A | 6/1999 | Knipe et al. | 6,778,155 B2 | 8/2004 | Doherty et al. |
| 5,936,758 | A | 8/1999 | Fisher et al. | 6,779,260 B1 | 8/2004 | Brandenburg et al. |
| 5,939,785 | A | 8/1999 | Klonis et al. | 6,794,119 B2 | 9/2004 | Miles |
| 5,959,763 | A | 9/1999 | Bozler et al. | 6,811,267 B1 | 11/2004 | Allen et al. |
| 5,986,796 | A | 11/1999 | Miles | 6,819,469 B1 | 11/2004 | Koba |
| 5,999,306 | A | 12/1999 | Atobe et al. | 6,822,628 B2 | 11/2004 | Dunphy et al. |
| 6,028,690 | A | 2/2000 | Carter et al. | 6,829,132 B2 | 12/2004 | Martin et al. |
| 6,038,056 | A | 3/2000 | Florence et al. | 6,833,668 B1 | 12/2004 | Yamada et al. |
| 6,040,937 | A | 3/2000 | Miles | 6,843,936 B1 | 1/2005 | Jacobs |
| 6,049,317 | A | 4/2000 | Thompson et al. | 6,853,129 B1 | 2/2005 | Cummings et al. |
| 6,055,090 | A | 4/2000 | Miles | 6,855,610 B2 | 2/2005 | Tung et al. |
| 6,061,075 | A | 5/2000 | Nelson et al. | 6,859,218 B1 | 2/2005 | Luman et al. |
| 6,099,132 | A | 8/2000 | Kaeriyama | 6,861,277 B1 | 3/2005 | Monroe et al. |
| 6,107,115 | A | 8/2000 | Atobe et al. | 6,862,022 B2 | 3/2005 | Slupe |
| 6,113,239 | A | 9/2000 | Sampsell et al. | 6,862,029 B1 | 3/2005 | D'Souza et al. |
| 6,120,339 | A | 9/2000 | Alwan | 6,867,896 B2 | 3/2005 | Miles |
| 6,127,765 | A | 10/2000 | Fushinobu | 6,870,581 B2 | 3/2005 | Li et al. |
| 6,147,790 | A | 11/2000 | Meier et al. | 6,882,480 B2 | 4/2005 | Yanagisawa |
| 6,160,833 | A | 12/2000 | Floyd et al. | 6,914,245 B2 | 7/2005 | Sone et al. |
| 6,180,428 | B1 | 1/2001 | Peeters et al. | 6,947,200 B2 | 9/2005 | Huibers |
| 6,195,196 | B1 | 2/2001 | Kimura et al. | 6,977,391 B2 | 12/2005 | Frischknecht |
| 6,201,633 | B1 | 3/2001 | Peeters et al. | 6,995,890 B2 | 2/2006 | Lin |
| 6,232,936 | B1 | 5/2001 | Gove et al. | 6,999,225 B2 | 2/2006 | Lin et al. |
| 6,238,755 | B1 | 5/2001 | Harvey et al. | 7,015,885 B2 | 3/2006 | Novotny et al. |
| 6,282,010 | B1 | 8/2001 | Sulzbach et al. | 7,019,458 B2 | 3/2006 | Yoneda |
| 6,284,342 | B1 | 9/2001 | Ebisawa et al. | 7,034,984 B2 | 4/2006 | Pan et al. |
| 6,295,154 | B1 | 9/2001 | Laor et al. | 7,042,643 B2 | 5/2006 | Miles |
| 6,297,072 | B1 | 10/2001 | Tilmans et al. | 7,046,374 B1 | 5/2006 | Barbarossa |
| 6,303,986 | B1 | 10/2001 | Shook | 7,060,895 B2 | 6/2006 | Kothari et al. |
| 6,323,982 | B1 | 11/2001 | Hornbeck | 7,123,216 B1 | 10/2006 | Miles |
| 6,365,229 | B1 | 4/2002 | Robbins | 7,126,741 B2 | 10/2006 | Wagner et al. |
| 6,379,988 | B1 | 4/2002 | Peterson et al. | 7,153,016 B2 | 12/2006 | Chen |
| 6,426,124 | B2 | 7/2002 | Olster et al. | 7,161,728 B2 | 1/2007 | Sampsell et al. |
| 6,426,461 | B1 | 7/2002 | Ginter et al. | 7,164,520 B2 | 1/2007 | Palmateer et al. |
| 6,447,126 | B1 | 9/2002 | Hornbeck | 7,184,202 B2 * | 2/2007 | Miles et al. ............. 359/321 |
| 6,455,927 | B1 | 9/2002 | Glenn et al. | 7,393,712 B2 | 7/2008 | Smith et al. |
| 6,462,392 | B1 | 10/2002 | Pinter et al. | 7,424,198 B2 * | 9/2008 | Palmateer et al. ........ 385/147 |
| 6,465,355 | B1 | 10/2002 | Horsley | 7,456,497 B2 | 11/2008 | Higashi |
| 6,466,354 | B1 | 10/2002 | Gudeman | 7,715,080 B2 * | 5/2010 | Natarajan et al. ........ 359/245 |
| 6,466,358 | B2 | 10/2002 | Tew | 7,816,164 B2 * | 10/2010 | Kothari et al. ............ 438/48 |
| 6,472,739 | B1 | 10/2002 | Wood et al. | 2001/0003487 A1 | 6/2001 | Miles |
| 6,473,274 | B1 | 10/2002 | Maimone et al. | 2001/0004085 A1 | 6/2001 | Gueissaz |
| 6,480,177 | B2 | 11/2002 | Doherty et al. | 2001/0055146 A1 | 12/2001 | Atobe et al. |
| 6,489,670 | B1 | 12/2002 | Peterson et al. | 2002/0012364 A1 | 1/2002 | Kalian et al. |
| 6,495,895 | B1 | 12/2002 | Peterson et al. | 2002/0015215 A1 | 2/2002 | Miles |
| 6,496,122 | B2 | 12/2002 | Sampsell | 2002/0043706 A1 | 4/2002 | Jerominek et al. |
| 6,507,385 | B1 | 1/2003 | Nishiyama et al. | 2002/0052392 A1 | 5/2002 | Day et al. |
| 6,525,416 | B2 | 2/2003 | Hauser et al. | 2002/0056898 A1 | 5/2002 | Lopes et al. |
| 6,538,312 | B1 | 3/2003 | Peterson et al. | 2002/0056900 A1 | 5/2002 | Liu et al. |
| 6,545,335 | B1 | 4/2003 | Chua et al. | 2002/0057565 A1 | 5/2002 | Seo |
| 6,548,908 | B2 | 4/2003 | Chua et al. | 2002/0070931 A1 | 6/2002 | Ishikawa |
| 6,549,338 | B1 | 4/2003 | Wolverton et al. | 2002/0075551 A1 | 6/2002 | Daneman |
| 6,552,840 | B2 | 4/2003 | Knipe | 2002/0075555 A1 | 6/2002 | Miles |
| 6,558,820 | B2 | 5/2003 | Raychaudhuri et al. | 2002/0126364 A1 | 9/2002 | Miles |
| 6,574,033 | B1 | 6/2003 | Chui et al. | 2002/0160583 A1 | 10/2002 | Song |
| 6,583,921 | B2 | 6/2003 | Nelson | 2002/0187254 A1 | 12/2002 | Ghosh |
| 6,589,625 | B1 | 7/2003 | Kothari et al. | 2003/0043157 A1 | 3/2003 | Miles |
| 6,600,201 | B2 | 7/2003 | Hartwell et al. | 2003/0054588 A1 | 3/2003 | Patel et al. |
| 6,603,182 | B1 | 8/2003 | Low et al. | 2003/0062186 A1 | 4/2003 | Boroson et al. |
| 6,606,175 | B1 | 8/2003 | Sampsell et al. | 2003/0072070 A1 | 4/2003 | Miles |
| 6,625,047 | B2 | 9/2003 | Coleman, Jr. | 2003/0075794 A1 | 4/2003 | Felton et al. |
| 6,627,814 | B1 | 9/2003 | Stark | 2003/0104651 A1 | 6/2003 | Kim et al. |
| 6,630,786 | B2 | 10/2003 | Cummings et al. | 2003/0108306 A1 | 6/2003 | Whitney et al. |
| 6,632,698 | B2 | 10/2003 | Ives | 2003/0144034 A1 | 7/2003 | Hack et al. |
| 6,643,069 | B2 | 11/2003 | Dewald | 2003/0152787 A1 | 8/2003 | Arakawa et al. |
| 6,650,455 | B2 | 11/2003 | Miles | 2003/0152872 A1 | 8/2003 | Miles |
| 6,661,084 | B1 | 12/2003 | Peterson et al. | 2003/0155643 A1 | 8/2003 | Freidhoff |
| 6,666,561 | B1 | 12/2003 | Blakley | 2003/0161126 A1 | 8/2003 | Wilkinson et al. |
| 6,674,159 | B1 | 1/2004 | Peterson et al. | 2003/0183916 A1 | 10/2003 | Heck et al. |
| 6,674,562 | B1 | 1/2004 | Miles | 2003/0184412 A1 | 10/2003 | Gorrell |
| 6,680,792 | B2 | 1/2004 | Miles | 2003/0202264 A1 | 10/2003 | Weber et al. |
| 6,690,444 | B1 | 2/2004 | Wilkinson et al. | 2003/0202265 A1 | 10/2003 | Reboa et al. |
| 6,710,908 | B2 | 3/2004 | Miles et al. | 2003/0202266 A1 | 10/2003 | Ring et al. |

| | | | | | | |
|---|---|---|---|---|---|---|
| 2004/0051929 A1 | 3/2004 | Sampsell et al. | | JP | 2001-351998 | 12/2001 |
| 2004/0058532 A1 | 3/2004 | Miles et al. | | JP | 2002-062491 | 2/2002 |
| 2004/0061492 A1 | 4/2004 | Lopes et al. | | JP | 2002-062492 | 2/2002 |
| 2004/0076008 A1 | 4/2004 | Ikeda | | JP | 2002-258310 | 9/2002 |
| 2004/0080382 A1 | 4/2004 | Nakanishi et al. | | JP | 2002-296519 | 10/2002 |
| 2004/0080807 A1 | 4/2004 | Chen et al. | | JP | 2002-312066 | 10/2002 |
| 2004/0100677 A1 | 5/2004 | Huibers et al. | | JP | 2002-328313 | 11/2002 |
| 2004/0126953 A1 | 7/2004 | Cheung | | JP | 2002-357846 | 12/2002 |
| 2004/0140557 A1 | 7/2004 | Sun et al. | | JP | 2003-57571 | 2/2003 |
| 2004/0145049 A1 | 7/2004 | McKinnell et al. | | JP | 2003-075741 | 3/2003 |
| 2004/0147056 A1 | 7/2004 | McKinnell et al. | | JP | 2003-233024 | 8/2003 |
| 2004/0150319 A1 | 8/2004 | Tomimatsu et al. | | JP | 2003-315693 | 11/2003 |
| 2004/0160143 A1 | 8/2004 | Shreeve et al. | | JP | 2003-330001 | 11/2003 |
| 2004/0163472 A1 | 8/2004 | Nagahara | | JP | 2004-053852 | 2/2004 |
| 2004/0166606 A1 | 8/2004 | Forehand | | JP | 2004-78107 | 3/2004 |
| 2004/0173886 A1 | 9/2004 | Carley | | JP | 2004-118001 | 4/2004 |
| 2004/0174583 A1 | 9/2004 | Chen et al. | | WO | WO 90/05795 | 5/1990 |
| 2004/0179281 A1 | 9/2004 | Reboa | | WO | WO 94/28452 | 12/1994 |
| 2004/0183990 A1 | 9/2004 | Guang et al. | | WO | WO 95/01624 | 1/1995 |
| 2004/0184133 A1 | 9/2004 | Su et al. | | WO | WO9530924 | 11/1995 |
| 2004/0212026 A1 | 10/2004 | Van Brocklin et al. | | WO | WO9717628 | 5/1997 |
| 2004/0217378 A1 | 11/2004 | Martin et al. | | WO | WO 98/06118 | 2/1998 |
| 2004/0217919 A1 | 11/2004 | Pichl et al. | | WO | WO9952006 A2 | 10/1999 |
| 2004/0218251 A1 | 11/2004 | Piehl et al. | | WO | WO9952006 A3 | 10/1999 |
| 2004/0218334 A1 | 11/2004 | Martin et al. | | WO | WO 00/16105 | 3/2000 |
| 2004/0218341 A1 | 11/2004 | Martin et al. | | WO | WO 00/17695 | 3/2000 |
| 2004/0227493 A1 | 11/2004 | Van Brocklin et al. | | WO | WO 01/45140 | 6/2001 |
| 2004/0240032 A1 | 12/2004 | Miles | | WO | WO 01/58804 | 8/2001 |
| 2004/0240138 A1 | 12/2004 | Martin et al. | | WO | WO 02/42716 | 5/2002 |
| 2004/0245588 A1 | 12/2004 | Nikkel et al. | | WO | WO03007049 A1 | 1/2003 |
| 2004/0263944 A1 | 12/2004 | Miles et al. | | WO | WO 03/023849 | 3/2003 |
| 2005/0001828 A1 | 1/2005 | Martin et al. | | WO | WO 03/026369 A1 | 3/2003 |
| 2005/0002079 A1 | 1/2005 | Novotny et al. | | WO | WO 03/054925 | 7/2003 |
| 2005/0035699 A1 | 2/2005 | Tsai | | WO | WO 03/070625 | 8/2003 |
| 2005/0036095 A1 | 2/2005 | Yeh et al. | | WO | WO03069413 A1 | 8/2003 |
| 2005/0036192 A1 | 2/2005 | Lin et al. | | WO | WO03073151 A1 | 9/2003 |
| 2005/0038950 A1 | 2/2005 | Adelmann | | WO | WO 03/084861 | 10/2003 |
| 2005/0042117 A1 | 2/2005 | Lin | | WO | WO 03/095706 | 11/2003 |
| 2005/0046919 A1 | 3/2005 | Taguchi et al. | | WO | WO 03/105198 | 12/2003 |
| 2005/0057442 A1 | 3/2005 | Way | | WO | WO2004006003 A1 | 1/2004 |
| 2005/0068583 A1 | 3/2005 | Gutkowski et al. | | WO | WO2004026757 A2 | 4/2004 |
| 2005/0069209 A1 | 3/2005 | Damera-Venkata et al. | | WO | WO 2004/077523 | 9/2004 |
| 2005/0093134 A1 | 5/2005 | Tarn | | WO | WO 2005/110914 | 11/2005 |
| 2005/0167795 A1 | 8/2005 | Higashi | | WO | WO 2005/114294 | 12/2005 |
| 2005/0184304 A1 | 8/2005 | Gupta et al. | | | | |
| 2005/0195462 A1 | 9/2005 | Lin | | | | |
| 2005/0200835 A1 | 9/2005 | Moy et al. | | | | |
| 2005/0253283 A1 | 11/2005 | DCamp | | | | |
| 2005/0254982 A1 | 11/2005 | Cadeddu | | | | |
| 2005/0275079 A1 | 12/2005 | Stark | | | | |
| 2006/0029732 A1 | 2/2006 | Kobrin et al. | | | | |
| 2006/0066935 A1 | 3/2006 | Cummings et al. | | | | |
| 2006/0148365 A1 | 7/2006 | Tsai | | | | |
| 2006/0274400 A1 | 12/2006 | Miles | | | | |
| 2007/0170568 A1 | 7/2007 | Chui et al. | | | | |
| 2009/0103167 A1 | 4/2009 | Tsai | | | | |
| 2009/0219605 A1 | 9/2009 | Lin et al. | | | | |
| 2011/0059275 A1 | 3/2011 | Stark | | | | |
| 2011/0097845 A1 | 4/2011 | Ables et al. | | | | |

FOREIGN PATENT DOCUMENTS

| | | |
|---|---|---|
| EP | 0 667 548 | 8/1995 |
| EP | 0 695 959 | 2/1996 |
| EP | 0 822 570 | 2/1998 |
| EP | 1418154 | 5/2004 |
| EP | 1 433 742 | 6/2004 |
| FR | 2841380 | 12/2003 |
| JP | 61-206244 | 9/1986 |
| JP | 63-162378 | 10/1988 |
| JP | 02-068513 | 3/1990 |
| JP | 03-199920 | 8/1991 |
| JP | 10-70287 | 3/1998 |
| JP | 10-070287 | 3/1998 |
| JP | 08-162006 | 6/1998 |
| JP | 11-326852 | 11/1999 |
| JP | 11 337953 | 12/1999 |
| JP | 2000-156287 | 6/2000 |
| JP | 2001-305514 | 10/2001 |
| JP | 2001-318324 | 11/2001 |

OTHER PUBLICATIONS

Office Action received Jan. 22, 2009 in Chinese App. No. 200510105059.8.
Greco et al., Optical properties of IPN-like networks polyethylene/poly(butylmethacrylate-co-styrene copolymer systems, III. Influence of copolymer crosslinkers, Polymer 42 (2001), 5089-5095.
European Search Report for EP 05255700.6.
European Search Report for EP 05255684.2.
European Search Report for application No. 05255634.7—1528 mailed on Jan. 31, 2007.
Liang, Zhi-Hao et al., "A Low Temperature Wafer-Level Hermetic MEMS Package Using UV Curable Adhesive", Electronic Components and Technology Conference, 2004 IEEE, pp. 1486-1491.
Akasaka, "Three-Dimensional IC Trends", Proceedings of IEEE, vol. 74, No. 12, pp. 1703-1714, (Dec. 1986).
Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Aratani K., et al., "Surface micromachined tuneable interferometer array," Sensors and Actuators, pp. 17-23. (1994).
Conner, "Hybrid Color Display Using Optical Interference Filter Array," SID Digest, pp. 577-580 (1993).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119-1121 (Sep. 1994).

Gosch, "West Germany Grabs the Lead in X-Ray Lithography," Electronics pp. 78-80 (Feb. 5, 1987).
Howard et al., "Nanometer-Scale Fabrication Techniques", VLSI Electronics: Microstructure Science, vol. 5, pp. 145-153 and pp. 166-173 (1982).
Jerman et al., "A Miniature Fabry-Perot Interferometer with a Corrugated Silicon Diaphragm Support", (1988).
Johnson "Optical Scanners", Microwave Scanning Antennas, vol. 1, p. 251-261, (1964).
Light over Matter, Circle No. 36 (Jun. 1993).
Miles, Mark, W., "A New Reflective FPD Technology Using Interferometric Modulation", The Proceedings of the Society for Information Display (May 11-16, 1997).
Newsbreaks, "Quantum-trench devices might operate at terahertz frequencies", Laser Focus World (May 1993).
Oliner et al., "Radiating Elements and Mutual Coupling", Microwave Scanning Antennas, vol. 2, pp. 131-141, (1966).
Raley et al., "A Fabry-Perot Microinterferometer for Visible Wavelengths", IEEE Solid-State Sensor and Actuator Workshop, Jun. 1992, Hilton Head, SC.
Sperger et al., "High Performance Patterned All-Dielectric Interference Colour Filter for Display Applications", SID Digest, pp. 81-83, (1994).
Stone, "Radiation and Optics, An Introduction to the Classical Theory", McGraw-Hill, pp. 340-343, (1963).
Walker, et al., "Electron-beam-tunable Interference Filter Spatial Light Modulator", Optics Letters vol. 13, No. 5, pp. 345-347, (May 1988).
Winton, John M., "A novel way to capture solar energy", Chemical Week, (May 1985).
Wu, "Design of a Reflective Color LCD Using Optical Interference Reflectors", ASIA Display '95, pp. 929-931, (Oct. 1995).

U.S. Appl. No. 11/045,738, filed Jan. 28, 2005, Palmateer, et al.
Moraja, et al., Advanced Getter Solutions at Wafer Level to Assure High Reliability to the last Generations MEMS, IEEE Reliability Physics Symposium Proceedings, 2003, pp. 458-459.
Sparks, et al. Chip-Level Vacuum Packaging of Micromachines Using NanoGetters, IEEE Transactions on Advanced Packaging, vol. 26 Issue 3, Aug. 2003, pp. 277-282.
Tilmans et al., The indent reflow sealing (IRS) technique—A method for the fabrication of sealed cavities for mems devices, Journal of Microelectromechanical Systems, 9(2), Jun. 2000.
Office Action dated May 23, 2008 in Chinese App. No. 200510105059.8.
Official Action dated Jun. 24, 2009 in European App. No. 05255634.7.
Office Action dated Aug. 21, 2009 in Chinese App. No. 200510105059.8.
Notice of Reasons for Rejection dated Sep. 9, 2008 in Japanese App. No. 2005-253492.
Jackson Classical Electrodynamics, John Wiley & Sons Inc., pp. 568-573, 1962.
Decision of Rejection dated Oct. 20, 2009 in Japanese App. No. 2005-253492.
Brief Communication dated Oct. 7, 2010 in European App. No. 05255634.7.
Miles, MEMS-based interferometric modulator for display applications, Proceedings of the SPIE, Micromachined Devices and Components V, Sep. 1999, pp. 20-28.
Decision of Rejection dated Dec. 29, 2010 in Chinese App. No. 200510105059.8.
Office Action dated Nov. 22, 2011 in Taiwan App. No. 094129173.

* cited by examiner

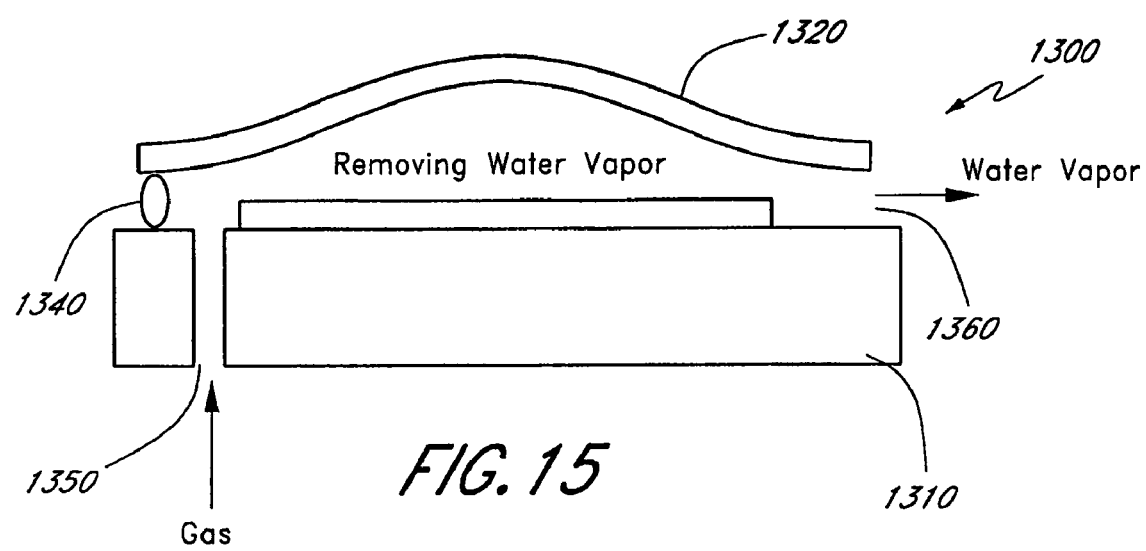

METHOD AND SYSTEM FOR PACKAGING A DISPLAY

RELATED APPLICATIONS

This application claims priority to U.S. Provisional Application Nos. 60/613,320, 60,613,377, 60/613,467, 60/613,484, 60/613,563, and 60/613,956, all filed Sep. 27, 2004. The contents of all of the aforementioned applications are hereby incorporated by reference in their entireties.

BACKGROUND

1. Field

The field of the invention relates to microelectromechanical systems (MEMS) and the packaging of such systems. More specifically, the field of the invention relates to interferometric modulators and methods of fabricating such modulators under ambient conditions.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices. The embodiments described herein provide a package structure and a method of manufacturing a package structure in ambient conditions.

An embodiment provides a method of packaging a display device. A transparent substrate having an interferometric modulator formed thereon is provided. A backplane is to the transparent substrate to form a package by applying a seal between the backplane and the transparent substrate, wherein the interferometric modulator is encapsulated by the package and the package has an opening.

In accordance with another embodiment, a microelectromechanical systems based device is provided. The device comprises a transparent substrate having a microelectromechanical device formed thereon, a backplane, and a sealing means. The sealing means is configured to join the backplane to the transparent substrate to encapsulate the microelectromechanical device within a package. The sealing means is applied between the backplane and the transparent substrate. Either the backplane or sealing means has a sealed opening.

According to another embodiment, a method of packaging a display device is provided. A transparent substrate having an interferometric modulator formed thereon is provided. A backplane is joined to the transparent substrate to encapsulate the interferometric modulator by applying a seal between the backplane and the transparent substrate, wherein the seal has an opening. The opening is sealed after joining the backplane to the transparent substrate.

According to yet another embodiment, a method for manufacturing a display device is provided. A transparent substrate is provided. The transparent substrate has a microelectromechanical device formed thereon. A backplane is joined to the transparent substrate to form a package by applying a seal between the backplane and the transparent substrate, wherein the microelectromechanical device is encapsulated by the package and the package has at least one opening. Water content in the package is reduced by introducing a gas through the at least one opening and into the package after joining the backplane to the transparent substrate.

In accordance with another embodiment, a method of manufacturing a display device is provided. A transparent having a microelectromechanical device formed thereon is provided. A sacrificial layer is deposited over the transparent substrate and the microelectromechanical device. A thin film is them deposited over the sacrificial layer to form a package by adhering the thin film to a perimeter of the transparent substrate, wherein the thin film has at least one opening. The sacrificial layer is removed by introducing a release material through the at least one opening and into the package. Water vapor may be removed from the interior of the package by introducing a gas through the at least one opening and into the package after removing the sacrificial layer.

According to yet another embodiment, a display device is provided. The display device comprises a transparent substrate having a microelectromechanical device formed thereon, a backplane, and a sealing means for joining the backplane to the transparent substrate to encapsulate the microelectromechanical device within the package. The sealing means is applied between the backplane and the transparent substrate and the package has at least one seal, wherein, to remove moisture content within the package, the at least one seal is configured to allow gas to glow therethrough prior to the at least one endseal being sealed.

BRIEF DESCRIPTION OF THE DRAWINGS

These and other aspects of the invention will be readily apparent from the following description and from the appended drawings (not to scale), which are meant to illustrate and not to limit the invention, and wherein:

FIG. 15 is a schematic view showing a process of removing water vapor from the package according to yet another embodiment.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
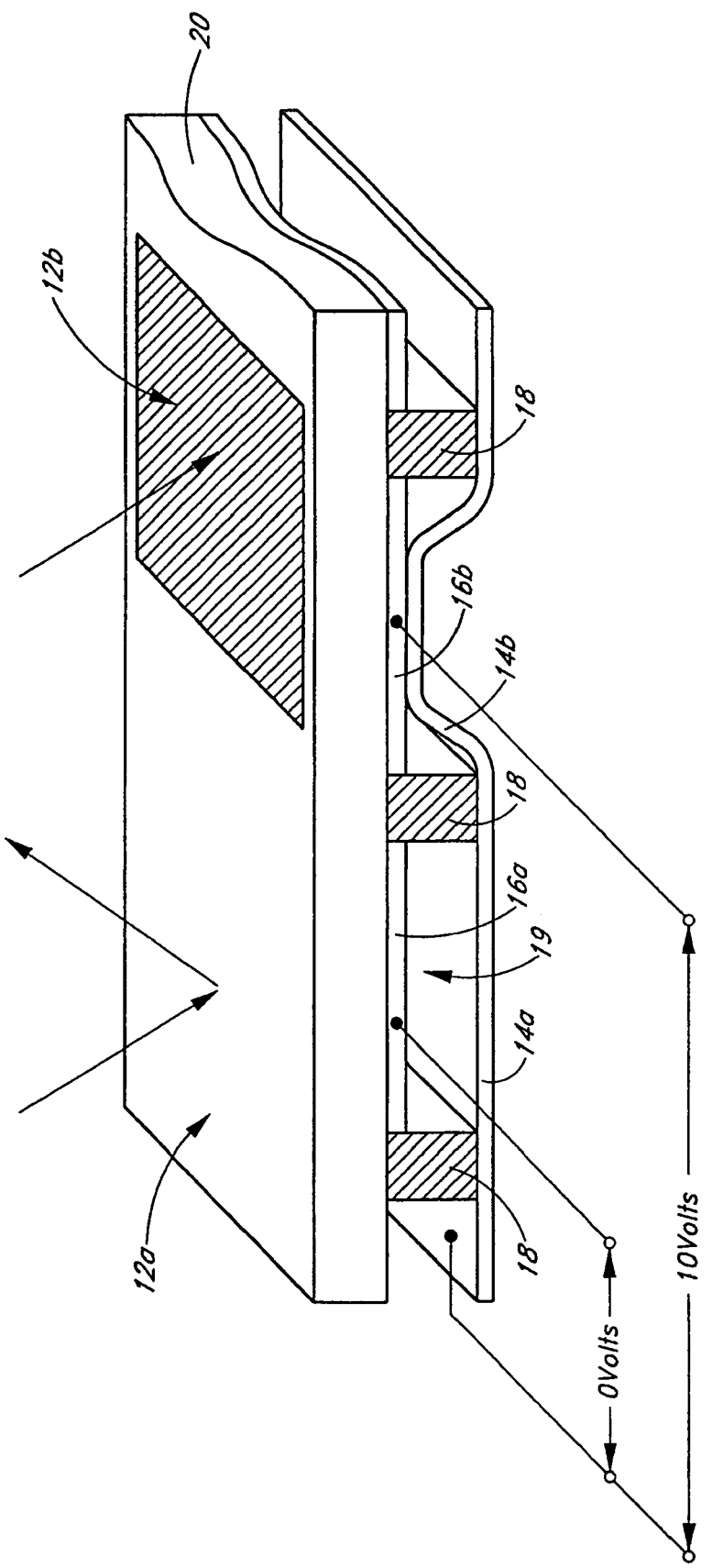
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a relaxed position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers 14a, 14b are separated from the fixed metal layers by a defined gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
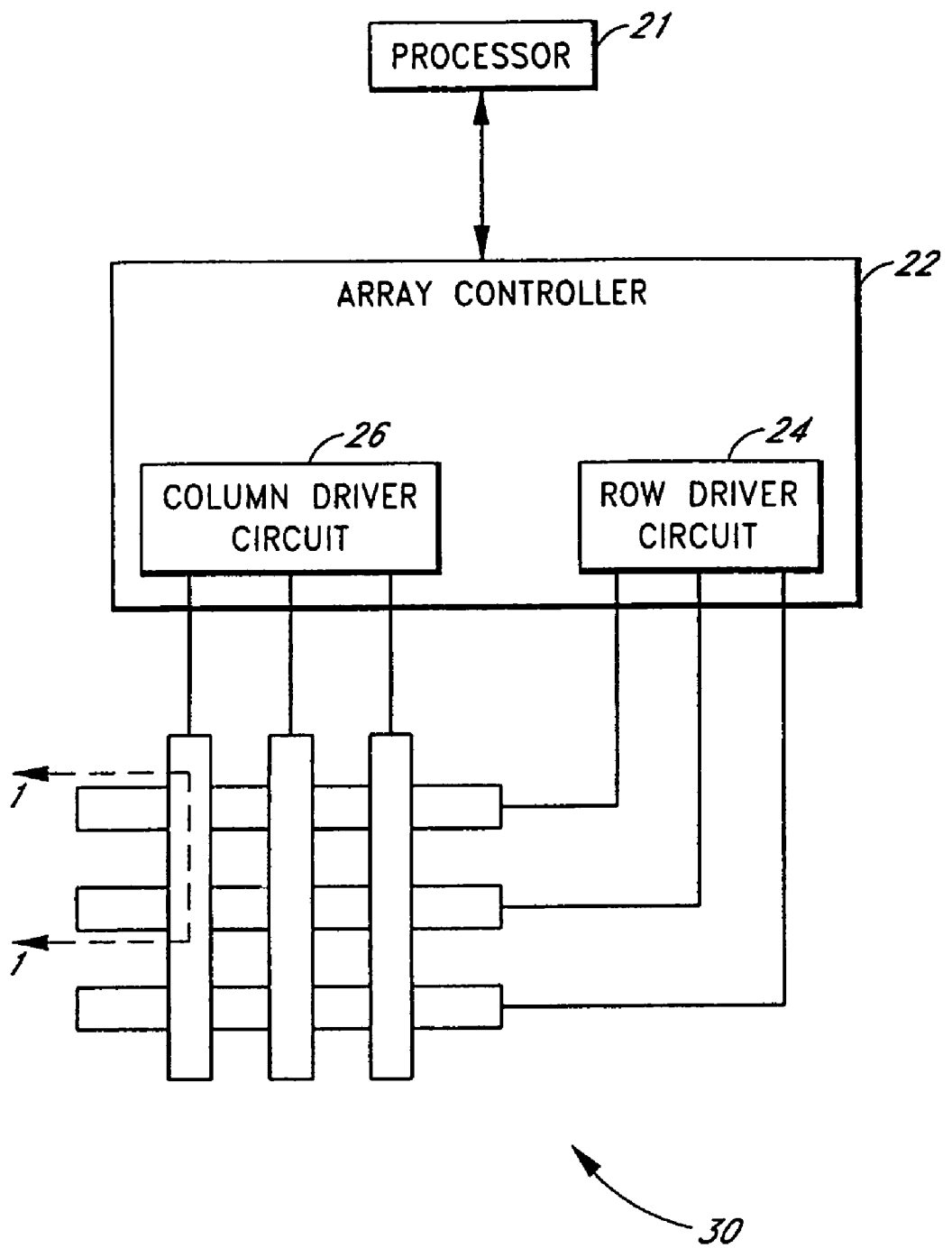
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
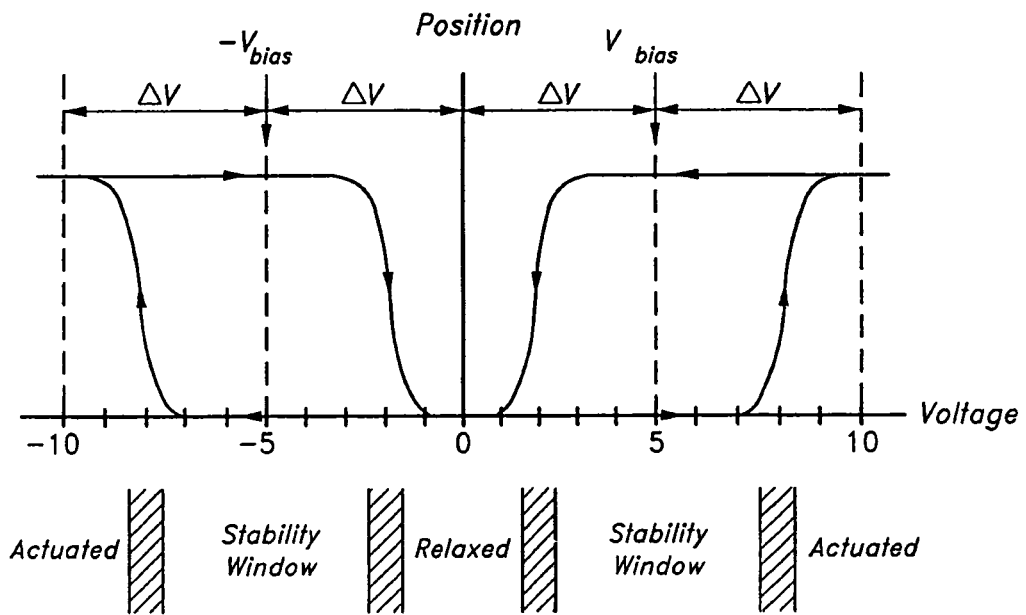
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to −Vbias, and the appropriate row to +ÿV, which may correspond to −5 volts and +5 volts respectively Relaxing the pixel is accomplished by setting the appropriate column to +Vbias, and the appropriate row to the same +ÿV, producing a zero volt potential difference across the pixel. In those rows where the row voltage is held at zero volts, the pixels are stable in whatever state they were originally in, regardless of whether the column is at +Vbias, or −Vbias. As is also illustrated in FIG. 4, it will be appreciated that voltages of opposite polarity than those described above can be used, e.g., actuating a pixel can involve setting the appropriate column to +Vbias, and the appropriate row to −ÿV. In this embodiment, releasing the pixel is accomplished by setting the appropriate column to −Vbias, and the appropriate row to the same −ÿV, producing a zero volt potential difference across the pixel.

Figure 5A:
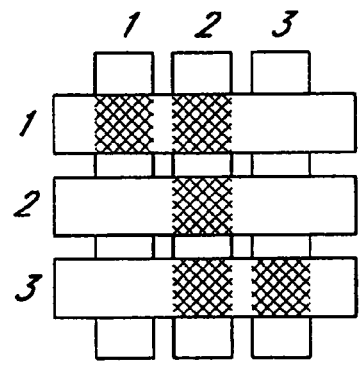
FIGS. 5A and 5B illustrate one exemplary timing diagram for row and column signals that may be used to write a frame of display data to the 3×3 interferometric modulator display of FIG. 2.
Figure 5B:
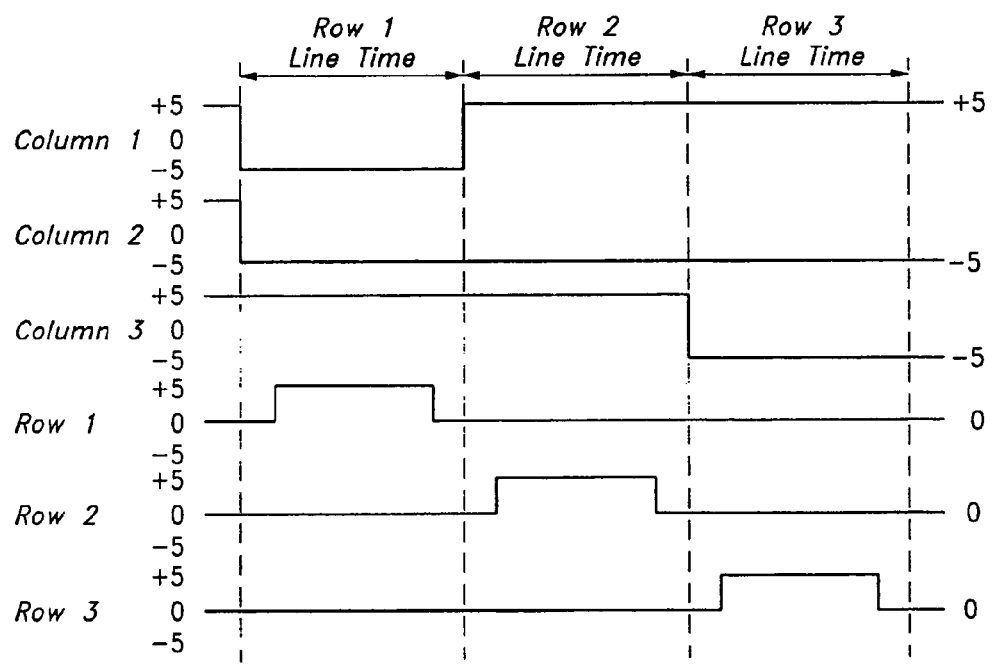

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
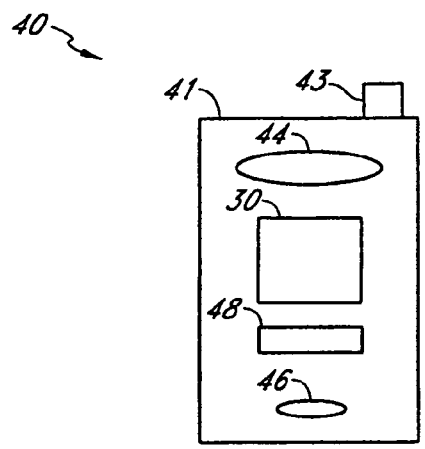
FIGS. 6A and 6B are system block diagrams illustrating an embodiment of a display device.
Figure 6B:
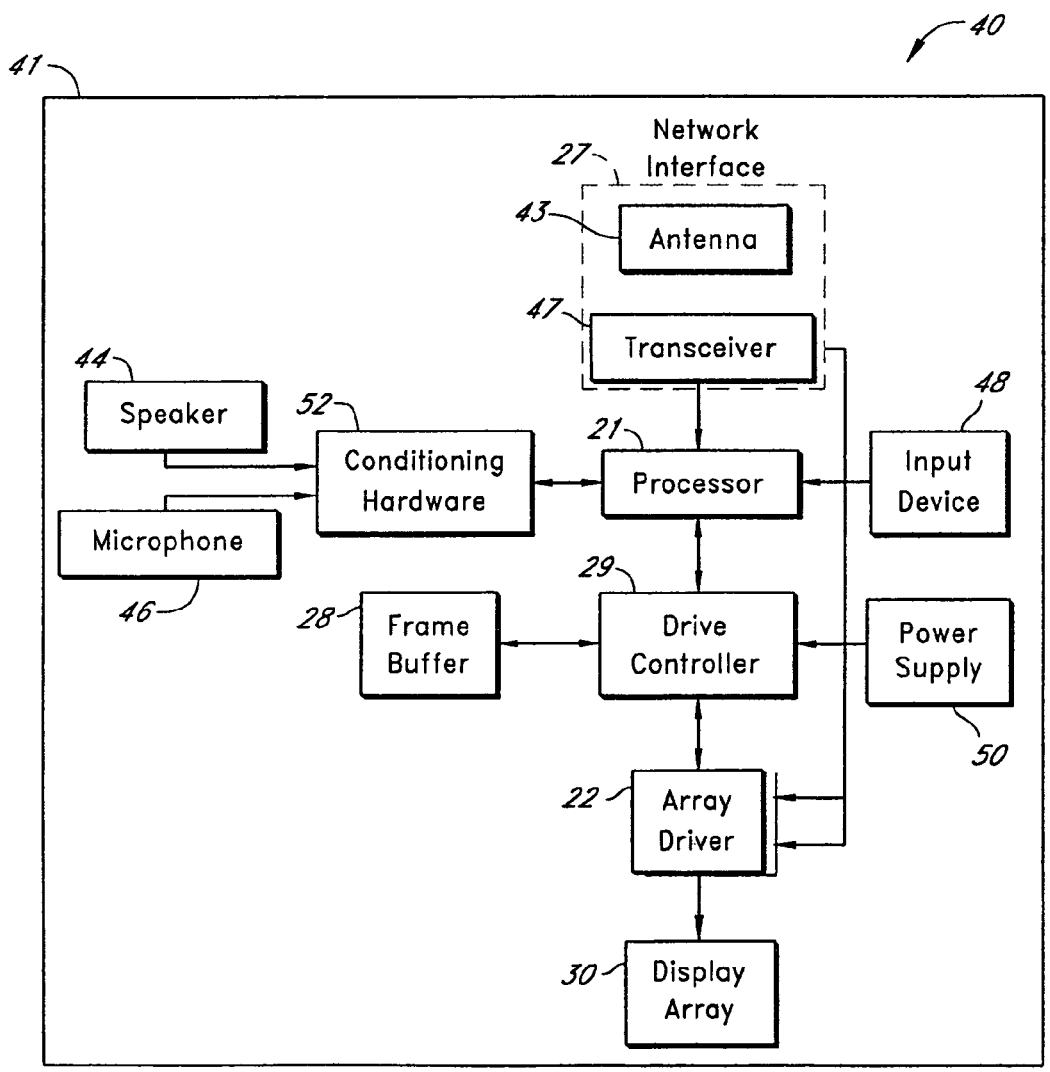

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 44 and a microphone 46. The processor 21 is also connected to an input device 48 and a driver controller 29. The driver controller 29 is coupled to a frame buffer 28, and to an array driver 22, which in turn is coupled to a display array 30.

A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 44, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
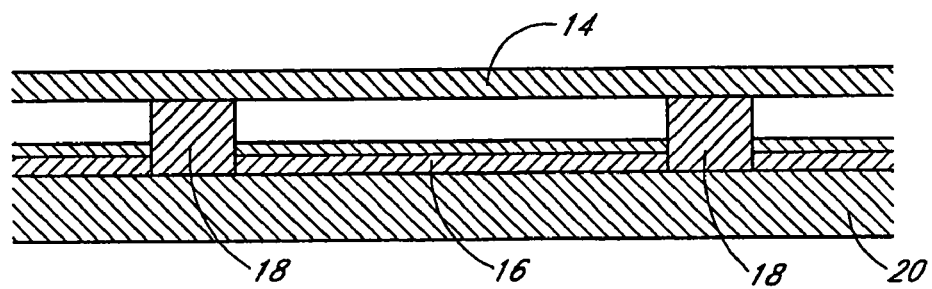
FIG. 7A is a cross section of the device of FIG. 1.
Figure 7B:
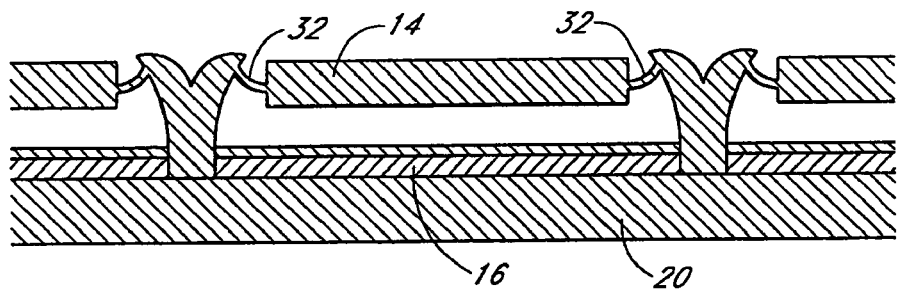
FIG. 7B is a cross section of an alternative embodiment of an interferometric modulator.
Figure 7C:
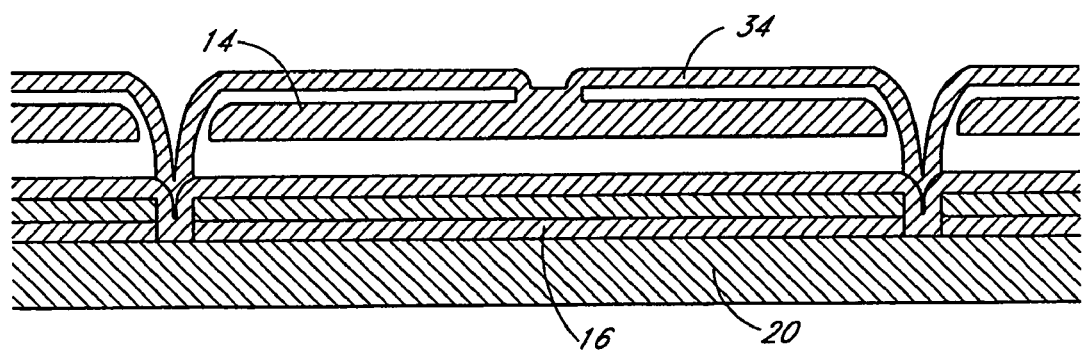
FIG. 7C is a cross section of another alternative embodiment of an interferometric modulator.

The details of the structure of interferometric modulators that operate in accordance with the principles set forth above may vary widely. For example, FIGS. 7A-7C illustrate three different embodiments of the moving mirror structure. FIG. 7A is a cross section of the embodiment of FIG. 1, where a strip of metal material 14 is deposited on orthogonally extending supports 18. In FIG. 7B, the moveable reflective material 14 is attached to supports at the corners only, on tethers 32. In FIG. 7C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of known techniques may be used to produce the above described structures involving a series of material deposition, patterning, and etching steps.

Figure 8:
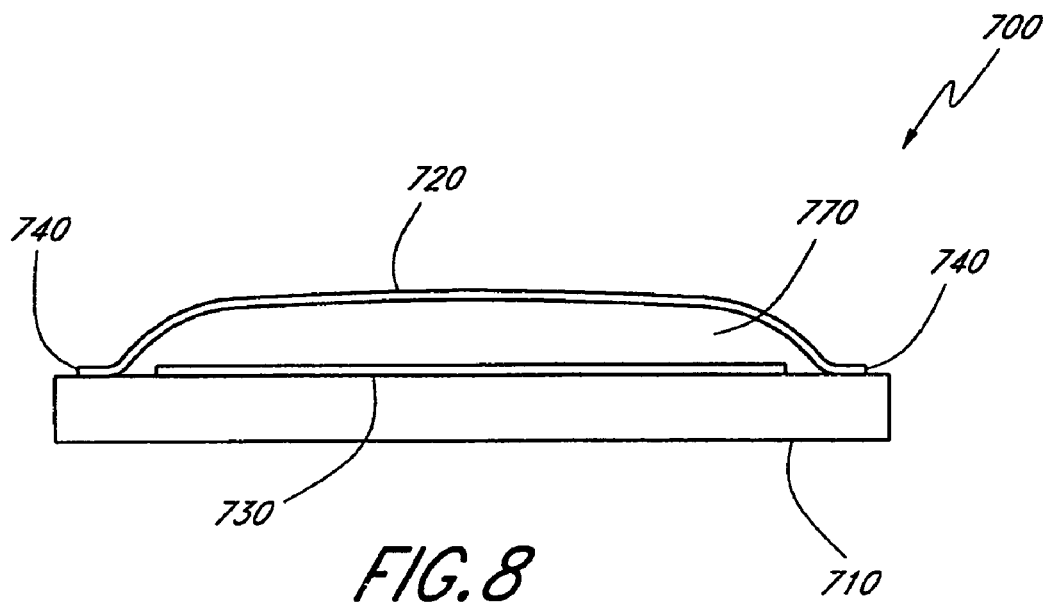
FIG. 8 is a cross-section of a basic package structure.

Packaging techniques for interferometric modulators will be described in more detail below. Interferometric modulators typically include moving parts, such as the movable mirrors 14a, 14b that must have a protected space in which to move. A schematic of a basic package structure 700 for an interferometric modulator is illustrated in FIG. 8. As shown in FIG. 8, a basic package structure 700 includes a transparent substrate 710 and a backplane cover or "cap" 720. As illustrated in FIG. 8, an interferometric modulator 730 is encapsulated within the package structure 700. Preferably, the backplane 720 and transparent substrate 710 are sealed together to protect the interferometric modulator 730 from harmful elements in the environment.

A method of packaging an interferometric modulator according to the embodiment shown in FIG. 8 will be discussed in more detail below. The packages and packaging methods described herein may be used for packaging any interferometric modulator, including, but not limited to, the interferometric modulators described above.

As discussed above, the interferometric modulator 730 is configured to reflect light through the transparent substrate and includes moving parts, such as the movable mirrors 14a, 14b. Therefore, to allow such moving parts to move, a gap or cavity 770 is preferably created between such moving parts and the backplane 720. The gap or cavity 770 allows the mechanical parts, such as the movable mirrors 14a, 14b, of the interferometric modulator 730 to move. It will be understood that, in an embodiment, the gap or cavity 770 is created when a backplane 720 having a recessed area is joined to the transparent substrate 710, as shown in FIG. 8.

The transparent substrate 710 may be any transparent substance capable of having thin film, MEMS devices built upon it. Such transparent substances include, but are not limited to, glass, plastic, and transparent polymers. Images are displayed through the transparent substrate 710, which serves as an imaging surface.

In accordance with an embodiment, an interferometric modulator 730 is preferably formed on a transparent substrate 710. It will be understood that the fixed mirrors 16a, 16b of the interferometric modulator 730 are adjacent the transparent substrate 710 and the movable mirrors 14a, 14b are formed over the fixed mirrors 16a, 16b such that the movable mirrors 14a, 14b may move within the cavity 770 of the package structure 700 of the embodiment shown in FIG. 8.

To form the interferometric modulator 730, the transparent substrate 710, in one embodiment, is covered with indium tin oxide (ITO). The ITO may be deposited by standard deposition techniques, including chemical vapor deposition (CVD) and sputtering, preferably to a thickness of about 500 Å. A relatively thin layer of chrome is preferably deposited over the ITO. The ITO/chrome bilayer is then etched and patterned into columns to form the column electrodes 16a, 16b. A layer of silicon dioxide ($SiO_2$) is preferably formed over the ITO/chrome columns to create partially reflective fixed mirrors 16a, 16b. A sacrificial layer of silicon (Si) is preferably deposited (and later released) over the structure to create a resonant optical cavity between the fixed mirrors 16a, 16b and the movable mirrors 14a, 14b. In other embodiments, this sacrificial layer may be formed of molybdenum (Mo), tungsten (W), or titanium (Ti).

Another mirror layer, preferably formed of aluminum, is deposited over the sacrificial layer of silicon to form the movable mirrors 14a, 14b of the interferometric modulator 730. This mirror layer is deposited and patterned into rows orthogonal to the column electrodes 16a, 16b to create the row/column array described above. In other embodiments, this mirror layer may comprise highly reflective metals, such as, for example, silver (Ag) or gold (Au). Alternatively, this mirror layer may be a stack of metals configured to give the proper optical and mechanical properties.

The sacrificial layer of silicon is removed, preferably using a gas etching process, after the movable mirrors 14a, 14b are formed to create the optical cavity between the fixed mirrors 16a, 16b and the movable mirrors 14a, 14b. In an embodiment, this sacrificial layer is removed after the backplane is joined to the transparent substrate through an opening in either the backplane or perimeter seal, as will be described in more detail below. Standard etching techniques may be used to remove the sacrificial layer of silicon. The particular release etching will depend on the material to be released. For example, xenon diflouride ($XeF_2$) may be used to remove the silicon sacrificial layer. In another embodiment, the sacrificial layer of silicon between the mirrors 16a, 16b, 14a, 14b is removed before the backplane 720 is joined to the transparent substrate 710. The skilled artisan will appreciate that each layer of the interferometric modulator 730 is preferably deposited and patterned using standard deposition techniques and standard photolithographic techniques.

The skilled artisan will understand that the backplane 720 serves a mechanical function, protecting the interferometric modulator 730 from contaminants in the environment. The backplane 720 along with the transparent substrate 710 and a seal 740 (which is described in more detail below) prevent mechanical interference, moisture, and contaminant gases from reaching and potentially damaging the interferometric modulator 730 within the package 700. The backplane 720 may therefore be formed of any suitable material, whether transparent or opaque, conductive or insulating. Suitable materials for the backplane 720 include, but are not limited to, glass (e.g., float, 1737, soda lime), plastic, ceramics, polymers, laminates, and metals and metal foils (e.g., stainless steel (SS302, SS410), Kovar, plated Kovar).

A sealing means or a seal 740 is typically provided to join the transparent substrate 710 and the backplane 720 to form the package structure 700. The seal 740 is typically a semi-hermetic seal, such as a conventional epoxy-based adhesive. In other embodiments, the seal 740 may be Polyisobutylene (PIB), o-rings, polyurethane, thin film metal weld, liquid spin-on glass, solders, polymers, or plastics, among other types of seals. In still other embodiment, the seal 740 may be a hermetic seal.

Once the backplane 720 and transparent substrate 710 are joined, the seal 740 may be cured and hardened. The skilled artisan will appreciate that the seal 740, which may be hardened, between the backplane 720 and the transparent substrate 710 is different from seals that may be applied after division of the package structure 700 into individual arrays.

It is generally desirable to manufacture several arrays of interferometric modulators on a single transparent substrate, apply the backplane, and then divide the structure into individual arrays. Once the seal 740 is hardened, the structure may be mechanically or laser scribed or otherwise prepared for division. Depending on the seal 740, as well as other factors, it may be necessary, after the division, to apply an endseal to the individual package structures or arrays.

Figure 9A:
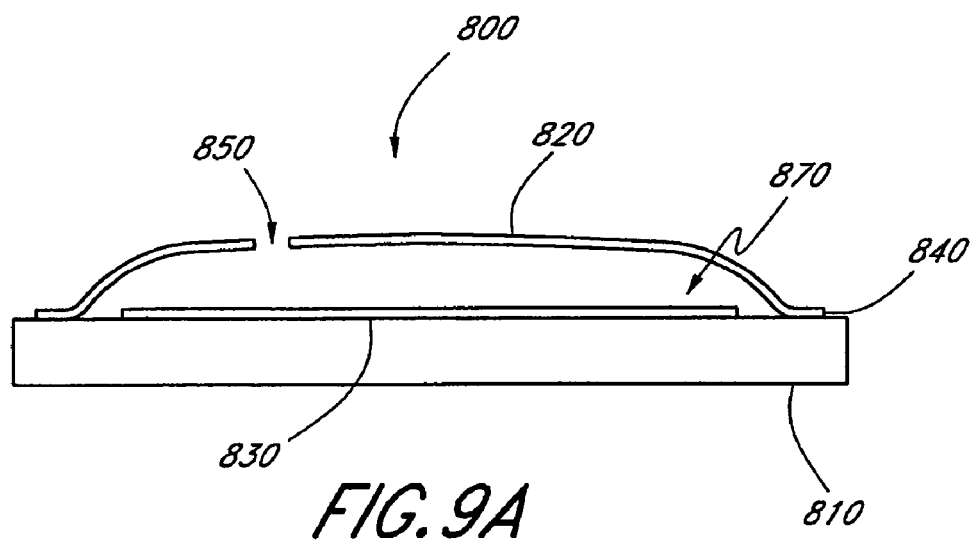
FIG. 9A is a cross-section of a package structure in accordance with an embodiment having an opening in the backplane.
Figure 9B:
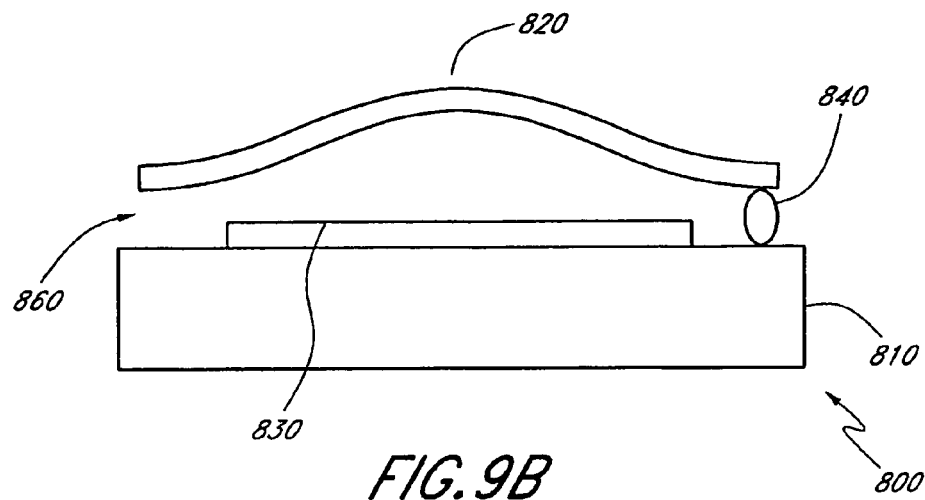
FIG. 9B is a cross-section of a package structure in accordance with an embodiment having an opening in the perimeter seal.
Figure 9C:
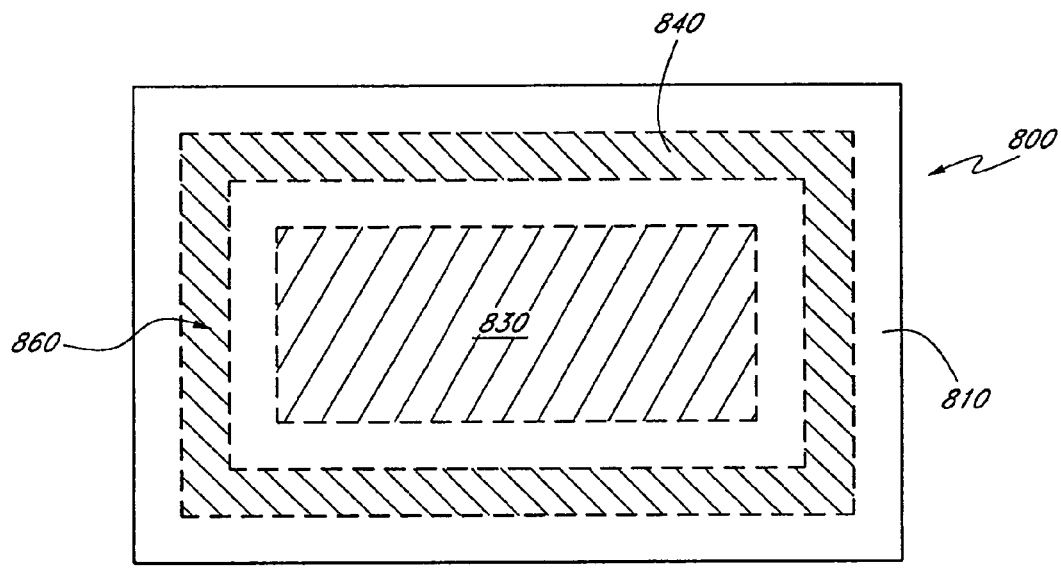
FIG. 9C is a top plan view of a package structure shown in FIG. 9B.

A side-view illustration of an embodiment of a package structure 800 having an endseal opening is shown in FIG. 9A. An endseal opening is typically either an opening in an otherwise continuous perimeter seal (as shown in FIG. 9B) or an opening or hole 850 in the backplane 820, as shown in FIG. 9A. FIG. 9C is a top plan view of the embodiment shown in FIG. 9B. As shown in FIGS. 9B and 9C, the perimeter seal is not continuously dispensed, leaving an opening 860 in the seal 840.

It will be understood that there may be more than one opening 850 in the backplane, as shown in FIGS. 9D-9G. In the embodiment shown in FIG. 9A, the opening or hole 850 may be closed to form an endseal or sealed opening to complete the package 800 with, for example, a metal or glass cap, metal foil, adhesive, solder, or UV or thermally cured polymer.

It is appreciated that there are other uses for metal caps. For example, metal caps may be used with a backplane formed of a printed circuit board (PCB) backplane that may include electronic interfaces for use with radio-frequency (RF) signals. A PCB backplane may serve not only as protection for circuitry that is integrated into the backplane but may also enhance RF circuit needs. For example, metal caps may be included for RF enhancement or protection. Antenna properties may also be incorporated into the PCB backplane or the interferometric modulator, including, but not limited to, the use of a metal backplane or a metal cap as an antenna for a cellular phone.

The use of such openings or holes 850 in the packaging process allows packaging to take place in ambient conditions, outside of a pressure controlled chamber. Generally ambient conditions are the laboratory conditions in a particle-free clean room typically having a temperature around 70° F. and relative humidity in the range of about 40-60%, and more preferably about 50%. The openings or holes 850 allow pressure within the package 800 to escape so that the pressure does not cause the transparent substrate 810 and the backplane 820 to come apart during the joining or sealing process because pressure does not build up within the package 800. Allowing the pressure within the package to escape via the openings 850 provides for constant pressure within the package 850, which also allows a more uniform seal width even if the seal is not dispensed with a uniform thickness.

The opening or hole 850 may also be configured to allow material to enter and exit the package 800. In particular, the opening or hole 850 may be configured to allow for application of a solvent to the interferometric modulator 830 for removal of a spacer or sacrificial layer, which will be described in more detail below. The skilled artisan will understand that an endseal may not be necessary, as will be described in more detail below.

Generally, it is desirable to minimize the permeation of water vapor into the package structure 800 and thus control the environment inside the package structure 800. The package structure 800 may be hermetically sealed to ensure the environment within the package structure 800 remains constant regardless of the surrounding environment. An example of a hermetic sealing process is disclosed in U.S. Pat. No. 6,589,625, the entirety of which is hereby incorporated by reference.

In one embodiment having a hermetic seal, the seal 840 is a hermetic barrier that acts as an environmental barrier preventing all air and water vapor from flowing through the seal 840 and entering the package structure 800. Suitable materials for a hermetic seal include, but are not limited to, welds, solders, adhesives mixed with molecular sieves, such as a zeolite. The adhesive component alone cannot act as a suitable environmental barrier because it will eventually allow moisture and other contaminants to permeate into the package structure 800. A semi-hermetic seal 840 of one of the aforementioned materials is desirable for space-critical environments because the seal 840 can be very thin and inexpensive, relative to other sealing techniques, such as welding and soldering. The semi-hermetic seal 840 may be applied through simple in-line manufacturing processes, whereas the techniques of welding and soldering for hermetic seals require very high temperature processes that can damage the package structure 800, are relatively expensive, and tend to occupy much more space because a welded or soldered seal is thicker. It will be understood that a semi-hermetic seal may include an adhesive that is not mixed with any molecular sieves or desiccants.

In one embodiment, the zeolites may include aluminosilicate-structured minerals, such as sodium aluminosilicate. In another embodiment, the zeolites may include microporous silicate-structured minerals. It will be appreciated that active components, other than zeolites, that can act as absorbing filters on the molecular level can also be used. In one embodiment, the adhesives may be a low outgassing adhesive. In other embodiments, the adhesives may be adhesives with varied outgassing. A desiccant used in the seal may be a calcium dioxide, strontium oxide (SRO), silica gels, montmorillonite clay (preferably a magnesium aluminum silicate), molecular sieves (zeolites such as $Na_{12}AlO_3SiO_{212}XH_2O$), or calcium sulfates.

The skilled artisan will understand that the amount of material for the seal 840 will depend on the estimated amount of moisture or contaminant gases that will need to be removed from within the package structure 800 during the lifetime of the package structure 800. The amount of material for the seal 840 also depends not only on the amount of moisture or contaminant gases inside the package structure 800 when the package is formed, but also the permeation rate of the seal 800 and the outgassing potential of the package components.

Zeolites may absorb water molecules at relatively high temperatures. Zeolites can trap moisture and contaminant gases in their pores. The skilled artisan will understand that zeolites having deferent pore sizes can be selected for the seal 840 material to absorb different contaminants. In an embodiment, zeolites are selected to absorb contaminant molecules, such as aromatic branched-chain hydrocarbons that have critical diameters of up to ten angstroms. In another embodiment, zeolites having pore sizes between two and three angstroms may be selected to abort contaminant molecules having diameters of less than two angstroms, such as hydrogen and moisture molecules. In still another embodiment, zeolites having pore sizes of about fifty angstroms (50 Å) can be used to absorb nitrogen and carbon dioxide molecules. The skilled artisan will appreciate that the hermetic seal 840 may be comprised of a mixture of zeolites having various pore sizes.

The seal 840 is typically applied to the transparent substrate 810 along the perimeter, around the interferometric modulator 830. The skilled artisan will understand that, in an embodiment in which the package structure 800 contains more than one interferometric modulator 830, the seal 840 is typically applied to the transparent substrate 810 around the perimeter of the plurality of interferometric modulators 830. In certain embodiments, the seal 840 is preferably formed to a thickness in a range of about 1-20 microns, and more preferably in a range of about 12-18 microns, and even more preferably 15 microns. The skilled artisan will appreciate that the thickness of the seal 840 will depend on various factors, including the estimated lifetime of the device, the material of the seal 840, the amount of contaminants and moisture that are estimated to permeate into the package structure 800 during the lifetime, the humidity of the ambient environment, and whether a desiccant is included within the package structure 800 and the flatness of the backplane 820 and the transparent substrate 810. The backplane 820 is then positioned over the transparent substrate 810, and the transparent substrate 810 and the backplane 820 are sealed together by the seal 840 to form the package structure 800.

In some embodiments, an outer bead (not shown) of adhesive is applied around the perimeter of the seal 840. The outer bead may include a low permeation rate adhesive, which can provide additional environmental protection to the package structure 800. The outer bead of adhesive may be useful in an environment having a great deal of contaminants where the seal 840 alone cannot serve as an effective hermetic seal without being loaded with an impractical amount of the active component. For example, if the seal 840 includes a high portion of zeolites (e.g., more than 60 percent zeolites by weight), the seal 840 can become microscopically porous as well as highly viscous and thus difficult to apply. Such a seal 840 having a high portion of zeolites may not provide a robust mechanical support to the package structure 800. The outer bead may also provide additional mechanical support.

As shown in FIG. 9A, the backplane 820 may be formed with at least one opening 850 therein. A release material, such as xenon diflouride ($XeF_2$), may be introduced through the opening into the interior of the package structure 800 to remove the sacrificial layer within the interferometric modulator 830 (between the fixed mirrors 16a, 16b and the movable mirrors 14a, 14b). The number and size of these openings 850 may depend on the desired rate of removal of the sacrificial layer.

To remove a sacrificial layer of molybdenum (Mo), silicon (Si), tungsten (W), or titanium (Ti), xenon diflouride ($XeF_2$) may be introduced into the interior of the package structure 800 through an opening or openings 850 in the backplane 820. Such openings 850 in the backplane 820 are preferably created by etching an opening in the backplane 820. The xenon diflouride ($XeF_2$) reacts with the sacrificial layer to remove it. A sacrificial layer formed of spin-on glass or oxide is preferably gas etched or vapor phase etched to remove the sacrificial layer after the backplane 820 has been joined to the transparent substrate 810. The skilled artisan will appreciate that the removal process will depend on the material of the sacrificial layer.

After the sacrificial layer is removed, the opening(s) 850 in the backplane 820 are preferably sealed. In an embodiment, a thermally or UV cured polymer is used to seal these openings. The opening(s) may also be sealed with metal or glass caps, metal foil, adhesive, welds, or solder. The skilled artisan will appreciate that other materials may be used as well and that materials having high viscosity are preferred.

Figure 10:
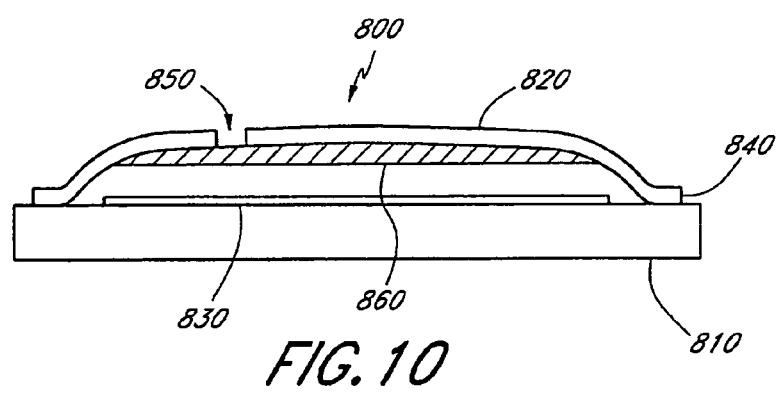
FIG. 10 is a cross-section of a package structure in accordance with an embodiment having an opening in the backplane and desiccant within the package.
Figure 9D:
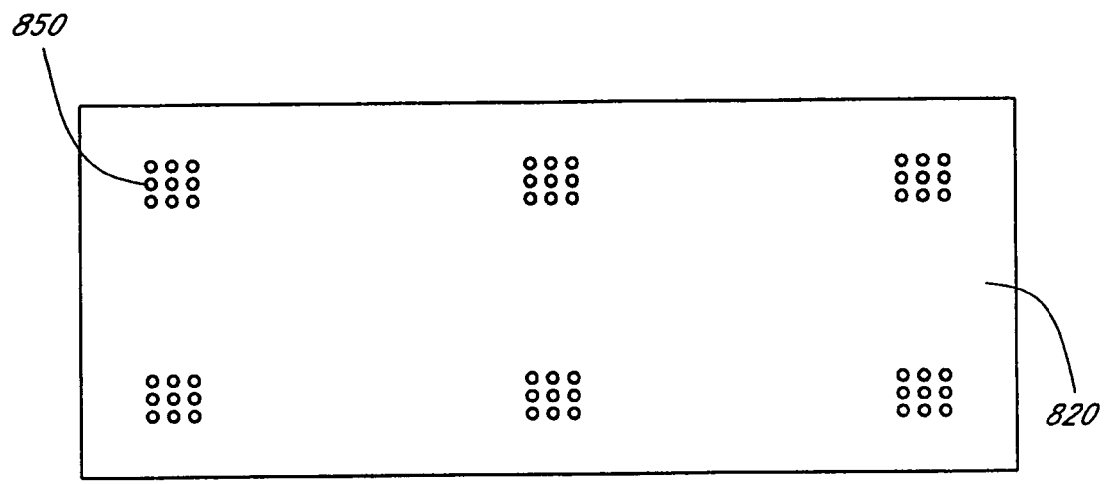
FIG. 9D is a top plan view of a backplane having openings according to an embodiment.
Figure 9E:
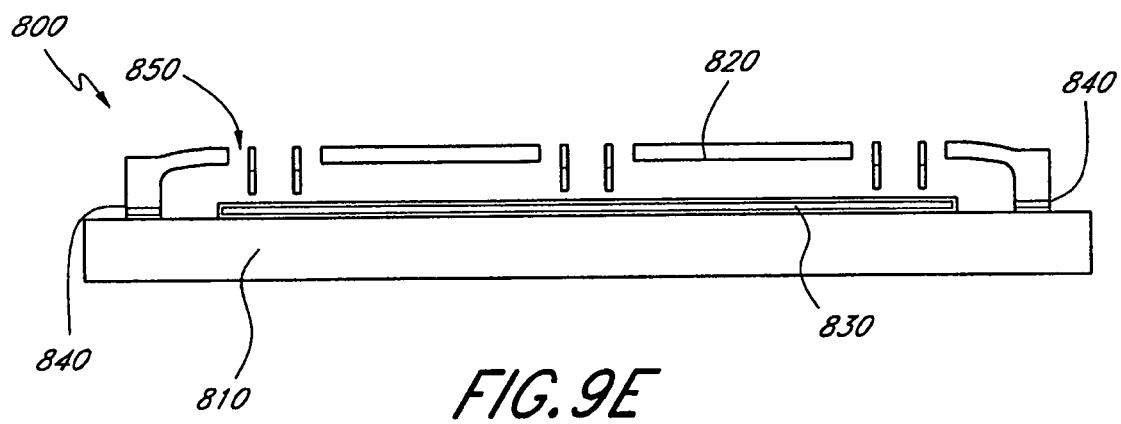
FIG. 9E is a cross-sectional view of a package structure having openings in the backplane.
Figure 9F:
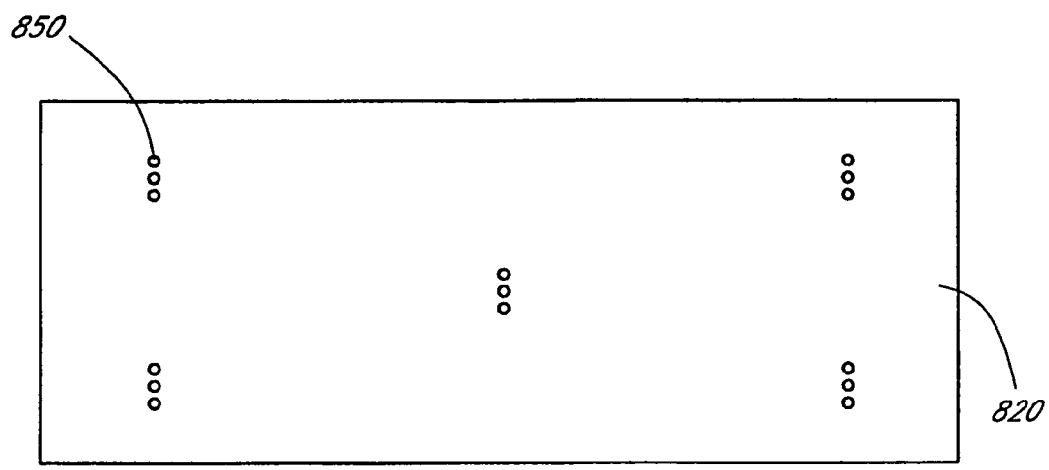
FIG. 9F is a top plan view of a backplane having openings according to another embodiment.
Figure 9G:
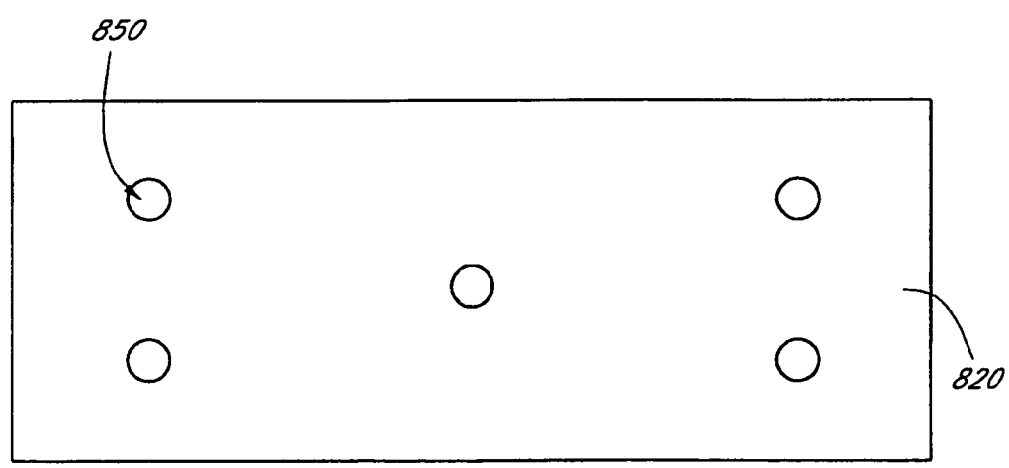
FIG. 9G is a top plan view of a backplane having openings according to yet another embodiment.

In another embodiment, following removal of the sacrificial layer and prior to sealing the opening(s) 850, a desiccant can be applied inside the package structure 800 in a vapor form through, for example, the opening(s) 850. In certain embodiments, a portion of a desiccant 860 could be included or applied to the interior surface of the backplane 820, as shown in FIG. 10. In addition, more or other types of desiccants can be applied to the interior of the package 800 through the opening(s) 850. The size of the opening(s) 850 is preferably small and can thereby allow both high-absorption rate desiccant or slow-absorption rate desiccant to be incorporated into the backplane 820 prior to joining of the backplane 820 to the transparent substrate 810 because the amount of air that will pass into the package 800 through the opening(s) without any vacuum or pressure driving force is sufficiently small. In a preferred embodiment, the opening 850 has a diameter in a range of about 10-100 microns. The opening(s) 850 allow for a desiccant 860 to be incorporated into the backplane 820 prior to assembly and for some gas or etchant to be injected through the opening(s) 850 to either activate the desiccant 860 or to deposit additional desiccant in the package 800.

As noted above, a desiccant may be used to control moisture resident within the package structure 800. However, if the seal 840 is fully hermetic, a desiccant is not necessary to prevent moisture from traveling from the atmosphere into the interior of the package structure 800.

The elimination of the need for a desiccant also allows the package structure 800 to be thinner, which is desirable. However, in certain embodiments, such as those having a semi-hermetic seal, a desiccant is desirable. Typically, in packages containing desiccants, the lifetime expectation of the device may depend on the lifetime of the desiccant. When the desiccant is fully consumed, the interferometric modulator display will fail as sufficient moisture enters the package structure to cause damage to the interferometric modulator. The theoretical maximum lifetime of the device is determined by the water vapor flux into the package as well as the amount and type of desiccant.

It is understood that in an embodiment of the package structure having a hermetic seal, the lifetime of the device is not dependent on the desiccant capacity, or the geometry of the seal. In such a package structure, the interferometric modulator will not fail due to a consumed desiccant.

As mentioned above, a desiccant may be used to reduce moisture resident within the package structure 800. Desiccants may be used for packages that have either hermetic or semi-hermetic seals. In a package having a semi-hermetic seal, a desiccant may be used to control moisture moving into the package from the environment. The skilled artisan will appreciate that a desiccant may not be necessary for a hermetically sealed package, but may be desirable to control moisture within the package structure 800. For packages having hermetic seals, desiccants may be provided within the package to absorb any moisture that moves into the package during the manufacturing process.

Generally, any substance that can trap moisture while not interfering with the optical properties of the interferometric modulator 830 may be used as the desiccant. Suitable desiccant materials include, but are not limited to, zeolites, molecular sieves, surface adsorbents, bulk adsorbents, and chemical reactants. The skilled artisan will appreciate that the desiccant material should be selected based on a variety of factors, including the estimated amount to contaminant gases in the environment as well as the absorption rate and amount of the desiccant material.

The desiccant may be in different forms, shapes, and sizes. In addition to being in solid form, the desiccant may alternatively be in powder form. These powders may be inserted directly into the package or they may be mixed with an adhesive for application. In an alternative embodiment, the desiccant may be formed into different shapes, such as cylinders or sheets, before being applied inside the package.

In another embodiment, the desiccant may be applied after the transparent substrate 810 and the backplane 820 are joined. According to this embodiment, as shown in FIG. 9A, a small hole or opening 850 is formed in the backplane 820. The skilled artisan will appreciate that more than one hole or opening 850 may be formed in the backplane 820. In the embodiment shown in FIG. 9A, the opening or hole 850 is formed preferably prior to joining the backplane 820 to the transparent substrate 810. The opening or hole 850 allows desiccant to be injected into individual package structures 800 after the backplane 820 and transparent substrate 810 have been sealed together. In this embodiment, sealing the opening or hole 850 is also required to form the sealed package structure 800 such that the interior of the package structure 800 is isolated from the surrounding ambient environment. The skilled artisan will appreciate that the opening or hole 850 can also facilitate a complete perimeter seal process, thereby eliminating the typical LCD-type endseal opening used in the perimeter seal 840. The opening or hole 850 in the backplane 820 is preferably sealed after injection of a desiccant into the package 800.

Those skilled in the art will also appreciate that, in certain embodiments, a self-aligning monolayer, or anti-stiction coating, is applied within the package 800 to allow the moving parts (e.g., elements 14a, 14b) of the interferometric modulator 830 to move easily. The self-aligning monolayer can be applied to the interior of the package structure 800 through the opening(s) 850. The monolayer preferably comprises a material configured to reduce the surface friction on the moving parts and/or repel water vapor from the moving parts. Exemplary materials for the self-aligning monolayer include, but are not limited to, fluoro silane, chloro-fluoro silane, methoxy silane, trichlorosilane, perfluorodecanoic carboxylic acid, octadecyltrichlorosilane (OTS), dichlorodimethylsilane, or hydrophobic or non-stick materials, such as PTFE, teflon, silicone, polystyrene, polyurethane (both standard and ultraviolet curable), a block copolymer containing a hydrophobic component (for example poly-methyl-methacrylate), or polysilazane (especially with polisiloxane). In some embodiments, an exemplary materials for a self-aligning monolayer include, but are not limited to, inorganic materials such as one or more of the following: graphite, diamond-like carbon (DLC), silicon carbide (SiC), a hydrogenated diamond coating, or fluorinated DLC. The presence of water vapor between the moving parts may increase the force needed to separate the moving parts, and is disadvantageous. Thus, reduction of the surface friction and/or the ability of water vapor to collect on the moving parts accordingly reduces the force necessary to separate the moving parts. However, it should be understood that typical ambient humidity levels do not provide sufficient water vapor to adversely affect the functioning of the interferometric modulator 830 within the package 800.

Generally, interferometric modulators have a higher tolerance (e.g., up to about 10%) for humidity requirements that organic light emitting diodes (OLED) displays. It is possible that water vapor permeates into the package 800 even if it is semi-hermetically or hermetically sealed. In certain embodiments in which a desiccant is placed in the interior of the package 800, a certain amount of moisture permeation may be tolerated, depending on the capacity of the desiccant. However, if there exists moisture or water vapor in an amount higher than the tolerance level, or if there is more water permeation into the package 800 than desired, the interferometric modulator 830 is likely to have a shortened lifetime or may fail to operate properly. Also, in certain embodiments, moisture, which has been created and/or permeated during assembly, may not have been properly removed before completing the fabrication of the package. Furthermore, the relative humidity level in the interior of the package, particularly without a desiccant, should be maintained less than the tolerance level so that the interferometric modulator 830 operates properly for the duration of its expected lifetime.

As shown in FIG. 9B, the package structure 800 may have an opening 860 in the perimeter seal 840 rather than, or in addition to, an opening in the backplane 820. The opening 860 in the seal 840 provides the same advantages as those described above for an opening in the backplane 820, including allowing for packaging at ambient conditions, and introduction of a release material, desiccant, and self-aligning monolayer. As with the opening in the backplane, in this embodiment, the opening 860 in the seal 840 is preferably closed to form a sealed opening after the joining of the transparent substrate 810 and the backplane 820 and introduction of desiccant, release material, and self-aligning monolayer, if desired. In a preferred embodiment, the opening 860 is sealed with a polymer, preferably UV or thermally cured. It is preferred that the polymer has a lower viscosity than that of the perimeter seal 840 such that increase surface tension helps the polymer to fully seal the opening 860.

Figure 11A:
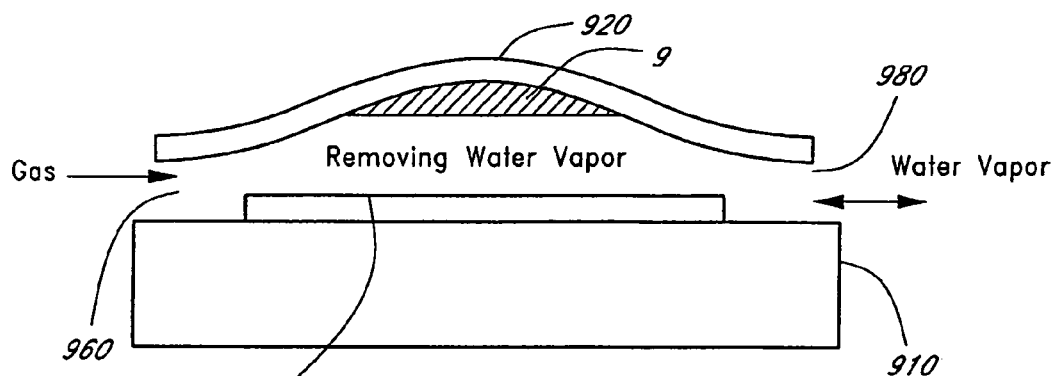
FIGS. 11A-11B are schematic views showing a process of removing water vapor from the package according to an embodiment.
Figure 11B:
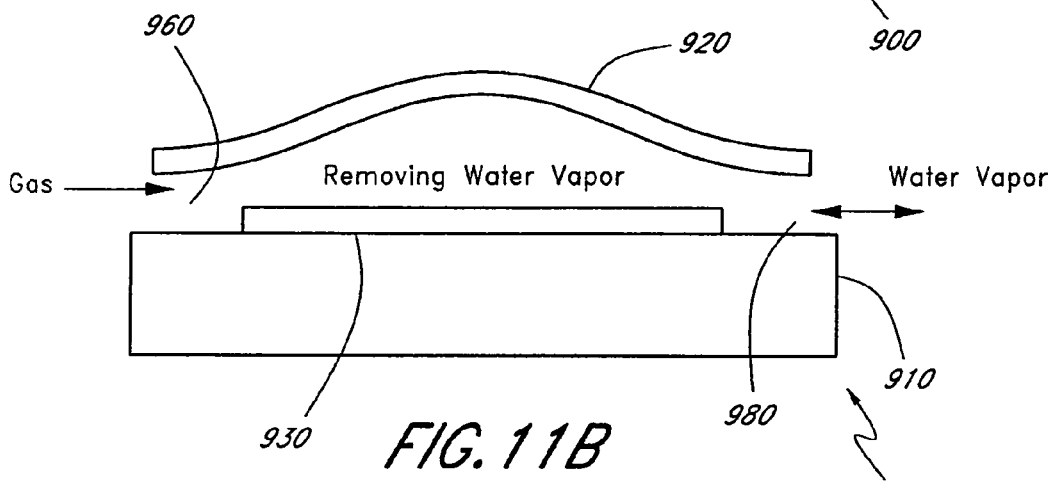
Figure 11C:
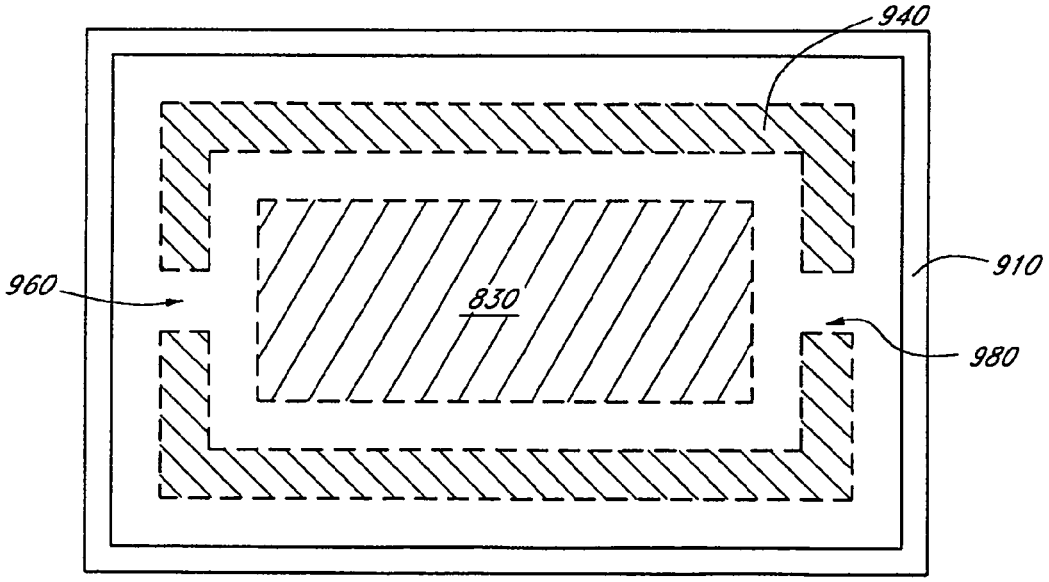
FIG. 11C is a top plan view of the embodiment shown in FIG. 11B.

FIGS. 11A-11B illustrate schematic diagrams showing a process of removing water vapor from the package according to an embodiment. The package 900 in FIG. 11A includes a desiccant 970, whereas the package 900 in FIG. 11B does not. FIG. 11C is a top plan view of the embodiment shown in FIG. 11B. As shown in FIG. 11C, the seal 940 is not dispensed continuously to create an inlet 960 and an outlet 980 in the seal 940. A water vapor removing process will be described in more detail below. As used herein, the term "water vapor" may include any kind of water, including, but not limited to, liquid water, gaseous water (in vapor phase), or condensed water on surfaces inside the package.

As shown in FIGS. 11A-11B, an inlet 960 and an outlet 980 are defined in the seal 940. In one embodiment, the inlet 960 is configured to supply a gas into the interior of the package 900 and the outlet 980 is configured to allow water vapor to exit the package 900. In the embodiments shown in FIGS. 11A-11B, one inlet and one outlet are defined in the seal 940.

In an alternative embodiment, one inlet and a plurality of outlets are defined in the seal. In an embodiment, at least one of the inlet 960 and outlet 980 is formed with the use of a scriber. In this embodiment, the shape of the inlet 960 and outlet 980 is substantially circular. In another embodiment, the inlet 960 and outlet 980 may have shapes other than circular. The skilled artisan will appreciate that the inlet 960 and/or outlet 980 may alternatively be formed by drilling or with the use of any other appropriate tool.

In certain embodiments, the inlet 960 and the outlet 980 have substantially the same size. In other embodiments, the inlet 960 and outlet 980 may be of different sizes. For example, the size of the inlet 960 can be greater than that of the outlet hole 980. Alternatively, the sizes of the inlet 960 and outlet 980 may be determined by the criteria of how effectively or easily they may be sealed after the water vapor is removed, as will be described in more detail below. In other words, so long as sealing can be effectively performed, the inlet 960 and outlet 980 can be of any size. The diameter of at least one of the inlet 960 and the outlet 980 is preferably in the range of about 10 microns-2 mm, and more preferably in the range of about 500 microns-1.5 mm, and even more preferably about 1 mm.

The inlet 960 and outlet 980 may be defined in the seal 940 simultaneously. Alternatively, one of the inlet 960 and the outlet 980 is defined first and thereafter the other is defined in the seal 940. For example, the inlet 960 may be formed first, and the outlet 980 may be formed after gas has been introduced through the inlet 960 and into the package 900. In this embodiment, the gas pressure in the interior of the package 900 can be increased so as to enhance the water vapor removal process.

In an embodiment, the gas introduced into the package 900 is a dry inert gas, preferably molecular nitrogen, $N_2$. In another embodiment, the gas is argon. It will be understood that the gas can be any type of gas that is effective in removing water vapor in the interior of the package 900 by, for example, pressure, drying, driving off (blowing), or vacuuming (sucking). The gas may be, for example, air, heated air, a heated gas, or a dry gas.

The gas may be continuously fed through the inlet 960 and into the interior of the package 900 until all of the water vapor is substantially removed. In an embodiment, whether the water vapor has been substantially removed can be determined by monitoring the humidity at the outlet port 980 to measure the humidity of the gas exiting the outlet 980.

In yet another embodiment, at least a portion of the water vapor can be removed from the interior of the package 900 through an opening in the package 900 with the use of, for example, a vacuum pump. The supplied gas can also remove other unwanted material (e.g., dust, other unwanted particles or liquid material) in addition to the water vapor. In this embodiment, the package 900 may be placed in a chamber (or vacuum chamber), and the gas may be fed into the package 900 by evacuating the chamber and then refilling it with a dry gas, such as nitrogen or argon. In this embodiment, at least a partial vacuum is created around the package 900 to draw out the water vapor from the interior of the package 900. It will be understood that, in this embodiment, only one opening in the package 900 is necessary. Thus, it is not necessary to have both an inlet 960 and an outlet 980 is this embodiment.

In an embodiment, water vapor may be removed during the fabrication process for the package 900. In this embodiment, a "release" or removal process can be used in which the sacrificial layer in the interferometric modulator 930 is etched away first, as described above. Then, water vapor (and/or any unwanted or unnecessary material) in the interior of the package 900 can be removed with the use of a carrier gas (e.g., nitrogen or argon) introduced into the package through the inlet 960 formed in the seal 940. In an embodiment, the removal process is performed by a MEMS etching system, such as, for example, X3 Series Xetch, which is available from XACIX, USA, and MEMS ETCHER, which is available from Penta Vacuum, Singapore.

Figure 12:
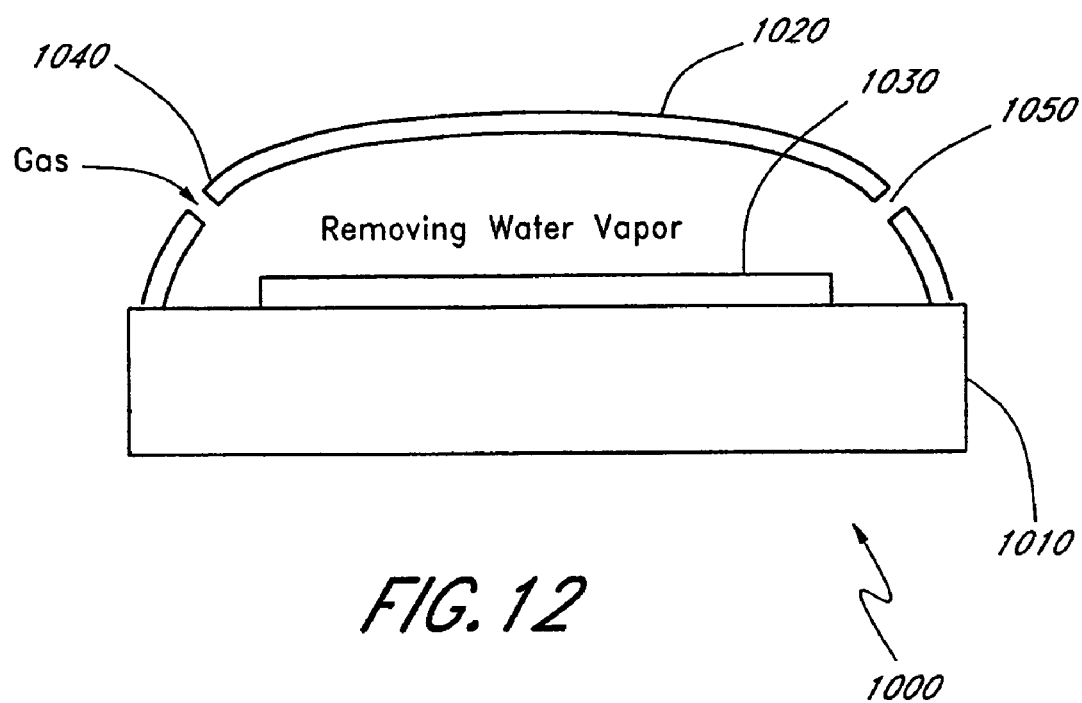
FIG. 12 is a schematic view showing a process of removing water vapor from the package according to another embodiment.

FIG. 12 is a schematic diagram showing a process of removing water vapor from the interior of the package according to another embodiment. In this embodiment, instead of sealing a backplane to the transparent substrate with a seal to encapsulate the interferometric modulator, a thin film 1020 is instead deposited over the transparent substrate 1010 and a sacrificial layer formed over the interferometric modulator 1030. No separate seal is required in this embodiment. Instead, the inlet 1040 and outlet 1050 are formed in the thin film 1020, as shown in FIG. 12. It will be understood that the sacrificial layer needs to be removed to create a cavity in which the moving parts (e.g., mechanical parts 14a, 14b) of the interferometric modulator 1030 can move. To remove the sacrificial layer, a release material, such as xenon diflouride ($XeF_2$), may be introduced through an opening 1040, 1050 in the thin film 1020 into the interior of the package structure 1000 to remove the sacrificial layer. After removing the sacrificial layer, the water vapor inside the package may be removed using the methods described above. A package structure having a thin film backplane is described in U.S. patent application Ser. No. 11/045,738, filed Jan. 28, 2005, which is hereby incorporated herein in its entirety.

Figure 13:
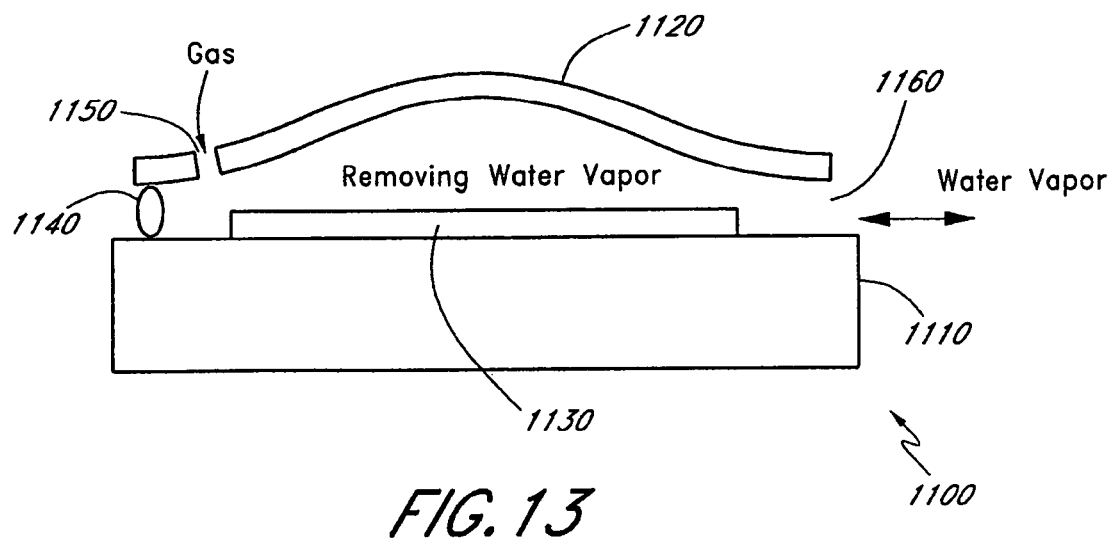
FIG. 13 is a schematic view showing a process of removing water vapor from the package according to still embodiment.

FIG. 13 is a schematic diagram showing a process of removing water vapor from a package 1100 according to another embodiment. In this embodiment, an inlet 1150 is formed in the backplane 1120 rather than in the seal 1140. As discussed above, since the backplane 1120 is formed of a material, such as glass, metal, or flexible polymer, the inlet 1150 can be effectively created in the backplane 1120 with the use of a scriber or laser, for example. An outlet 1160 is preferably formed in the seal 1140 by dispensing a non-continuous seal, as shown in FIG. 13. Gas may be fed into the package 1100 through the inlet 1150 to remove water vapor and/or unwanted material. Alternatively, it will be understood that the inlet may be formed in the seal and the outlet may be formed in the backplane.

Figure 14:
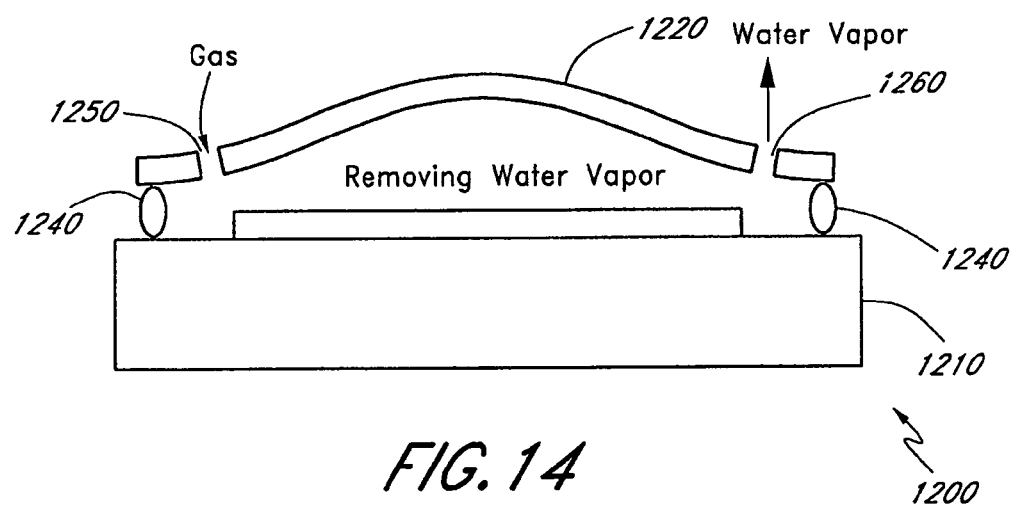
FIG. 14 is a schematic view showing a process of removing water vapor from the package according to yet another embodiment.

FIG. 14 is a schematic diagram showing a package configuration for removing water vapor from a package 1200 according to another embodiment. In this embodiment, both the inlet 1250 and the outlet 1260 are formed in the backplane 1220 and not in the seal 1240, as shown in FIG. 13. Once the inlet 1250 and outlet 1260 are formed, gas may be fed into the package 1200 to remove water vapor and/or unwanted material. It will be understood that the inlet 1250 and outlet 1260 maybe be formed in the backplane 1220 during the fabrication process for the backplane 1220.

FIG. 15 is a schematic diagram showing a package configuration for removing water vapor from a package 1300 according to yet another embodiment. In this embodiment, an inlet 1350 is formed in the transparent substrate 1310 and the outlet 1360 is formed in the seal 1340 by dispensing a non-continuous seal, as shown in FIG. 15. As discussed above, since the transparent substrate 1310 is formed of a material, such as, for example, glass, plastic, or polymer, the inlet 1350 can be effectively defined in the transparent substrate 1310 with the use of a scriber or a laser, for example. Once the inlet 1350 and outlet 1360 are formed, gas may be introduced into the package 1300 to remove water vapor from the interior of the package.

Figure 16A:
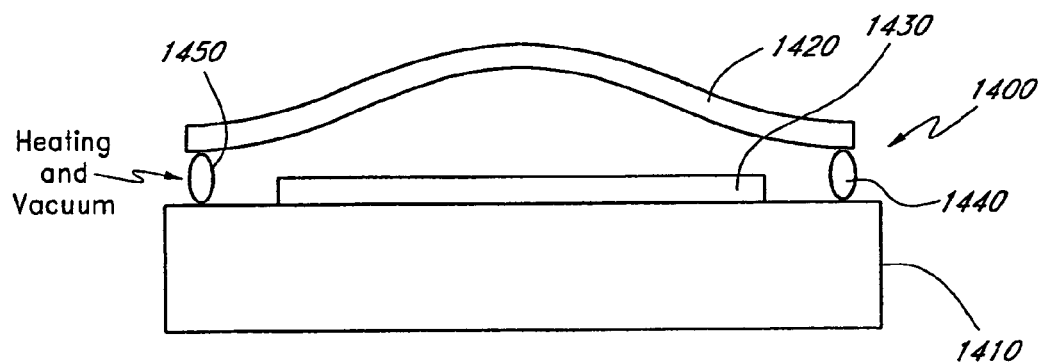
FIGS. 16A-16C is a schematic view showing a process of removing water vapor from the package according to yet another embodiment.
Figure 16B:
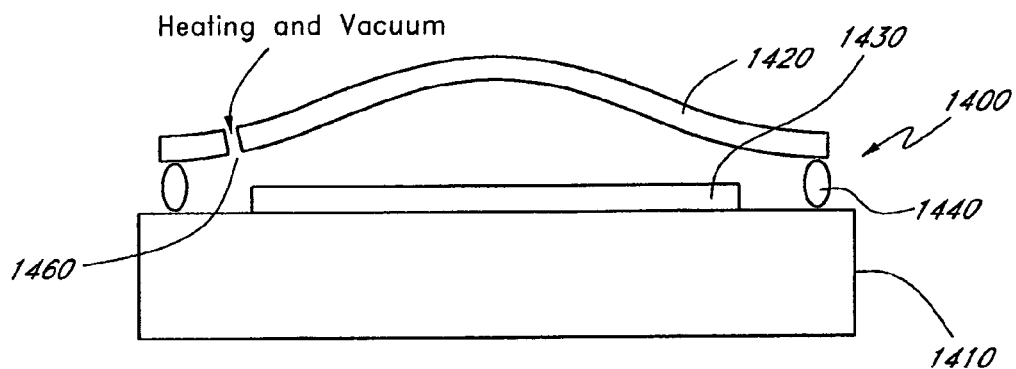
Figure 16C:
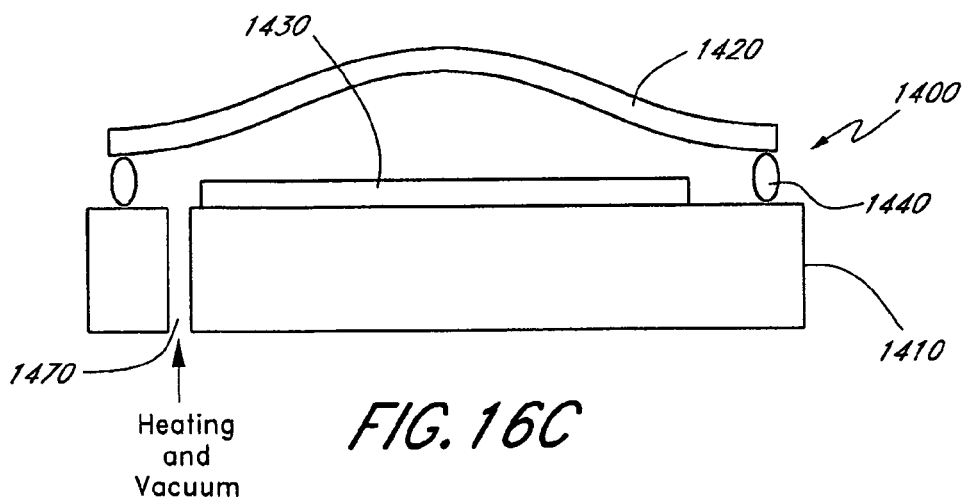

FIGS. 16A-16C are schematic diagrams showing a process of removing water vapor from a package 1400 according to another embodiment. In this embodiment, preferably only one opening is formed in the package 1400. As shown in FIG. 16A, the opening 1450 may be formed in the seal 1440. Alternatively, as shown in FIG. 16B, the opening 1460 may be formed in the backplane 1420. In another embodiment, as shown in FIG. 16C, the opening 1470 may be formed in the transparent substrate 1410. In these embodiments, heated air or a heated gas may be introduced into the package 1400 to dry the water vapor within the package 1400. Once the heated gas is supplied to the interior of the package 1400, vacuuming may also be performed to draw out any remaining water vapor from the interior of the package 1400. It will be understood that the opening 1450, 1460, 1470 can also be used to inject desiccant, a release material, or self-aligning monolayer, as described in detail above.

Figure 17A:
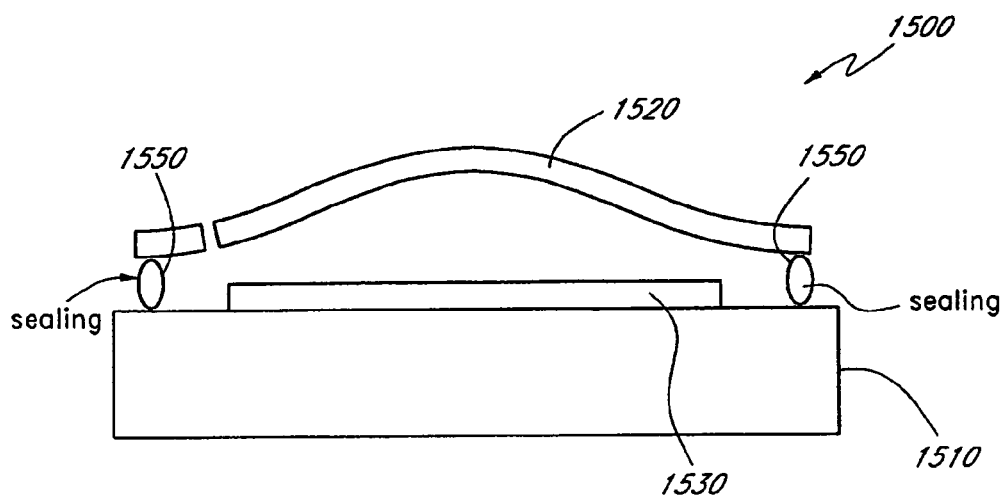
FIG. 17A is a schematic view showing a process of sealing openings according to an embodiment.
Figure 17B:
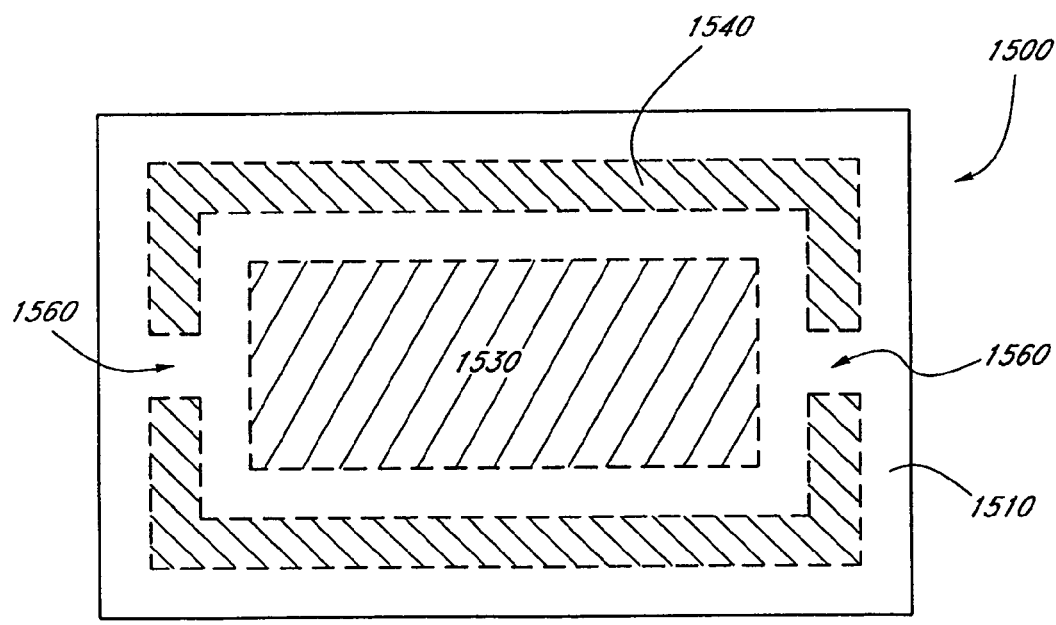
FIG. 17B is a top plan view of the embodiment shown in FIG. 17A prior to sealing the openings.

FIG. 17A is a schematic diagram of a process of sealing openings in a package 1500, according to an embodiment. After the water vapor and/or unwanted material is substantially or completely removed from the interior of the package 1600, any openings 1560 are preferably sealed to form an endseal. FIG. 17B is a top plan view of the embodiment shown in FIG. 17A prior to sealing the openings 1560. As shown in the top plan view of 17B, the openings 1560 in the seal 1540 are formed by dispensing a non-continuous seal 1540. In the embodiment shown in FIG. 17A, openings 1560 in the seal 1540 are sealed with the same material 1550 that forms the perimeter seal 1540. It will be understood that although FIG. 17A shows a sealing process for a package having openings in the seal 1540, the same or a similar sealing process can be performed for other embodiments. For example, openings in a backplane may be sealed with the same material that forms the backplane. Alternatively, openings in a transparent substrate may be sealed with the same material that forms the transparent substrate. The skilled artisan will appreciate that the openings may be sealed with alternative materials, including, but not limited to, thermally or UV cured epoxies, preferably having a low viscosity, welds, solders, metal caps, and glass caps.

Generally, the packaging process, including an endseal process, may be accomplished in a vacuum, pressure between a vacuum up to and including ambient pressure, or pressure higher than ambient pressure. The packaging process may also be accomplished in an environment of varied and controlled high or low pressure during the sealing process. There may be advantages to packaging the interferometric modulators in a completely dry environment, but it is not necessary.

As discussed above, an opening in the backplane or perimeter seal during the sealing process maintains equivalent pressure within the package structure and outside the package structure. The packaging environment may be of an inert gas at ambient conditions. Packaging at ambient conditions allows for a lower cost process because it provides more potential for versatility in equipment choice and because the device may be transported through ambient conditions without affecting the operation of the device.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of manufacturing a display device, comprising:
   providing a transparent substrate having an interferometric modulator formed thereon; and
   joining a backplane to the transparent substrate to form a package by applying a seal between the backplane and the transparent substrate, wherein the interferometric modulator is encapsulated by the package and the package has at least one opening.

2. The method of claim 1, further comprising sealing the at least one opening after joining the backplane to the transparent substrate.

3. The method of claim 1, further comprising introducing desiccant through the at least one opening after joining the backplane to the transparent substrate.

4. The method of claim 1, comprising:
   depositing a sacrificial layer over the transparent substrate and interferometric modulator; and
   depositing a thin film backplane over the sacrificial layer to form a package, wherein the thin film has at least one opening.

5. The method of claim 4, further comprising introducing a release material through the at least one opening after joining the backplane to the transparent substrate.

6. The method of claim 5, wherein the release material is xenon difluoride.

7. The method of claim 4, further comprising introducing a gas through the at least one opening and into the package after removing the sacrificial layer.

8. The method of claim 7, further comprising sealing the at least one opening after introducing the gas.

9. The method of claim 7, wherein the thin film has at least two openings.

10. The method of claim 7, wherein the gas is heated.

11. The method of claim 7, wherein the gas is nitrogen or argon.

12. The method of claim 1, further comprising introducing a self-aligning monolayer through the at least one opening after joining the backplane to the transparent substrate.

13. The method of claim 1, wherein the at least one opening is in the backplane.

14. The method of claim 13, further comprising sealing the at least one opening with a metal cap.

15. The method of claim 13, wherein the sealing is performed by soldering.

16. The method of claim 13, wherein the seal is a continuous seal.

17. The method of claim 1, wherein desiccant is applied to the backplane before joining the backplane to the transparent substrate.

18. The method of claim 1, wherein the method takes place in ambient conditions.

19. The method of claim 1, further comprising sealing the at least one opening with a polymer.

20. The method of claim 1, wherein the at least one opening is in the seal.

* * * * *